(12) United States Patent
Majima et al.

(10) Patent No.: US 11,529,794 B2
(45) Date of Patent: Dec. 20, 2022

(54) HETEROEPITAXIAL STRUCTURE AND METHOD FOR FORMING THE SAME, AND NANOGAP ELECTRODE

(71) Applicant: JAPAN SCIENCE AND TECHNOLOGY AGENCY, Kawaguchi (JP)

(72) Inventors: Yutaka Majima, Yokohama (JP); YoonYoung Choi, Yokohama (JP); Ikuko Shimada, Yokohama (JP); Ryo Toyama, Yokohama (JP); Mingyue Yang, Yokohama (JP)

(73) Assignee: JAPAN SCIENCE AND TECHNOLOGY AGENCY, Kawaguchi (JP)

( * ) Notice: Subject to any disclaimer, the term of this patent is extended or adjusted under 35 U.S.C. 154(b) by 0 days.

(21) Appl. No.: 17/213,527

(22) Filed: Mar. 26, 2021

(65) Prior Publication Data
US 2021/0213707 A1   Jul. 15, 2021

Related U.S. Application Data

(63) Continuation of application No. PCT/JP2019/034167, filed on Aug. 30, 2019.

(30) Foreign Application Priority Data

Oct. 2, 2018  (JP) .............................. JP2018-187109
Jan. 16, 2019 (JP) .............................. JP2019-005299

(51) Int. Cl.
*B32B 15/01* (2006.01)
*C23C 18/31* (2006.01)
(Continued)

(52) U.S. Cl.
CPC .............. *B32B 15/01* (2013.01); *C23C 18/31* (2013.01); *C30B 25/18* (2013.01); *B82Y 40/00* (2013.01)

(58) Field of Classification Search
None
See application file for complete search history.

(56) References Cited

U.S. PATENT DOCUMENTS

2005/0018363 A1* 1/2005 Hasegawa ............ G01R 33/093
                                                    29/603.08
2010/0258954 A1* 10/2010 Andoh ..................... H01L 24/85
                                                    257/784
(Continued)

FOREIGN PATENT DOCUMENTS

JP   2006265648 A   10/2006
JP   2013089913 A    5/2013
(Continued)

OTHER PUBLICATIONS

English translation of Written Opinion issued in Intl. Appln. No. PCT/JP2019/034167 dated Oct. 1, 2019, previously cited in IDS filed Mar. 26, 2021.
(Continued)

*Primary Examiner* — Seth Dumbris
(74) *Attorney, Agent, or Firm* — Rossi, Kimms & McDowell LLP

(57) ABSTRACT

A heteroepitaxial structure includes a first metal portion having a polycrystalline structure, a second metal portion on the first metal portion, the second metal portion has an island-shaped structure on the first metal portion, the second metal portion is provided corresponding to at least one crystalline grain exposed to a surface of the first metal portion, and the second metal portion and the at least one crystalline grain have a heteroepitaxial interface.

9 Claims, 23 Drawing Sheets

(51) Int. Cl.
*C30B 25/18* (2006.01)
*B82Y 40/00* (2011.01)

(56) References Cited

U.S. PATENT DOCUMENTS

| 2011/0287259 A1 | 11/2011 | Ying |
| 2014/0054788 A1 | 2/2014 | Majima |
| 2019/0041378 A1 | 2/2019 | Choi |

FOREIGN PATENT DOCUMENTS

| WO | 2010016798 A1 | 2/2010 |
| WO | 2012121067 A1 | 9/2012 |
| WO | 2017132567 A1 | 8/2017 |

OTHER PUBLICATIONS

Office Action issued in Japanese Appln. No. 2020-550206 dated Oct. 12, 2021. English machine translation provided.
Ambrozik. "The Spontaneous Deposition of Au on Pt (111) and Polycrystalline Pt." Journal of the Electrochemical Society. 2016: D3001-D3007. vol. 163, No. 12. Cited in Specification.
International Search Report issued in Intl. Appln. No. PCT/JP2019/034167 dated Oct. 1, 2019. English translation provided.
Written Opinion issued in Intl. Appln. No. PCT/JP2019/034167 dated Oct. 1, 2019.
Serdio, "Self-terminated Nanogap Electrodes by Electroless Gold Plating." Proceedings of the 61st JSAP Spring Meeting. 2014: 09-084. 17p-F11-10.
Onuma. "Fabrication of Nanogap Electrodes in Narrow Width." Proceedings of the 61st JSAP Spring Meeting. 2015: 08-158. 14p-A20-6. English translation provided.
Choi. "Single-Electron Transistors made by Pt-based Narrow Line Width Nanogap Electrodes." Proceedings of the 77th JSAP Autumn Meeting. 2016: 08-002. 13a-C42-2.
Azuma. "Gate Capacitance Dependence on Nanogap Electrode Structure in Nanoparticle Single-Electron Transistors." Proceedings of the 77th JSAP Autumn Meeting 2016: 08-003. 13a-C42-3. English translation provided.
Choi. "Robust Pt-based Nanogap Electrodes for Single-Electron Transistors." Proceedings of the 64th JSAP Spring Meeting. 2017: 08-039. 14p-E206-7.
Kwon. "Au Electroless-Plated Nanogap Electrodes on Pt Surface." Proceedings of the 64th JSAP Spring Meeting. 2017: 08-040. 14p-E206-8.
Koshimura. "Au Electroplated Nano-Gap Electrode on Pt Surface." Proceedings of the 64th JSAP Spring Meeting. 2017: 08-101. 15p-P5-3. English translation provided.
Vivitasari. "Gate Oscillation of Chemically Assembled Single-Electron Transistor Using 2 nm Au Nanoparticle." Proceedings of the 78th JSAP Autumn Meeting. 2017: 08-126. 7a-PB1-4.
Serdio. "Robust nanogap electrodes by self-terminating electroless gold plating." The Royal Society of Chemistry. Nanoscale. 2012: 7161-7167. vol. 4.
Alonso. "The Evaluation of Surface Diffusion Coefficients of Gold and Platinum Atoms at Electrochemical Interfaces from Combined STM-SEM Imaging and Electrochemical Techniques." Journal of Electrochemical Society. 1990: 2161-2166. vol. 137, No. 7.
Extended European Search Report issued in European Appln. No. 19869091.9 dated May 2, 2022.
Mitchell. "Homo- and hetero-epitaxial deposition of Au by surface limited redox replacement of Pb underpotentially deposited layer in one-cell configuration". Electrochimica Acta. 2012: 450-458. vol. 85. Cited in NPL 1.
Yasutake. "Simultaneous fabrication of nanogap gold electrodes by electroless gold plating using a common medical liquid". Applied Physics Letters. American Institute of Physics. 2007: 203107-1-203107-3. vol. 91, No. 20. Cited in NPL 1.
Cui. "Nanogap Electrodes towards Solid State Single-Molecule Transistors". Small. 2015: 6115-6141. vol. 11, No. 46. Cited in NPL 1.

\* cited by examiner

SEM secondary electron image

TEM dark field image

TEM bright field image

Electroless gold plating treatment
10 seconds × 3 times

Pretreatment solution A
+
Electroless gold plating treatment
10 seconds × 3 times Pretreatment solution B
+
electroless gold plating treatment
10 seconds × 3 times Pretreatment solution C
+
electroless gold plating treatment
10 seconds × 3 times Electroless gold plating treatment
10 seconds × 10 times Comparative Example Before heat treatment After heat treatment After heat treatment + electroless gold plating

HETEROEPITAXIAL STRUCTURE AND METHOD FOR FORMING THE SAME, AND NANOGAP ELECTRODE

CROSS-REFERENCE TO RELATED APPLICATIONS

This application is based upon and claims the benefit of priority from the prior Japanese Patent Application No. 2018-187109, filed on Oct. 2, 2018, the prior Japanese Patent Application No. 2019-005299, filed on Jan. 16, 2019, and PCT Application No. PCT/JP2019/034167 filed on Aug. 30, 2019, the entire contents of which are incorporated herein by reference.

FIELD

An embodiment of the present invention relates to a technology for performing heteroepitaxial growth by electroless plating. An embodiment of the present invention relates to a nanogap electrode including a region heteroepitaxial grown by electroless plating.

BACKGROUND

Electroplating and electroless plating are one of the techniques widely used in industry and are used in various applications. For example, the technique to process electrodes by gold plating is spreading in the production site of electronic components. Gold (Au) is a chemically very stable metal and is widely used in electronic components. For example, in an electronic component, since the wettability of solder and the wire bonding property are good, they are used as an electrode material. A gold (Au) film can be formed by electroplating. However, since gold (Au) is a soft metal, when a gold (Au) film is formed by electroplating, a plating film of cobalt (Co), nickel (Ni), or the like is formed on a base surface to harden it.

Plating has long been known in the art, but various studies have been carried out at present. For example, a study has been reported in which a gold (Au) film is grown in a layered form on platinum (Pt) by electroplating (for example, Stephen Ambrozik, Corey Mitchell, and Nikolay Dimitrov, "The Spontaneous Deposition of Au on Pt (111) and Polycrystalline Pt", Journal of The Electrochemical Society, 163 (12), D3001-D3007, 2016). Further, a technique of depositing gold (Au) reduced from gold chloride (III) on a surface of a spherical platinum (Pt) seed has been disclosed (for example, PCT International Publication No. WO2010/016798)

However, the technique of heteroepitaxial growth of precious metals by electroless plating has hardly been reported so far. While electroplating is a method of depositing a metal on a surface of a material by passing an electric current, electroless plating is a method of depositing a metal ion as a metal on a material by a chemical reaction based on the reducing power of the metal ion and the reducing agent. Therefore, it is difficult to grow the plating film depending on the kind of material in the electroless plating, and there is a problem that it is difficult to form a plating film having high adhesion and low contact resistance.

SUMMARY

A heteroepitaxial structure in an embodiment according to the present invention includes a first metal portion having a polycrystalline structure, a second metal portion on the first metal portion, the second metal portion has an island-shaped structure on the first metal portion, the second metal portion is provided corresponding to at least one crystalline grain exposed to a surface of the first metal portion, and the second metal portion and the at least one crystalline grain have a heteroepitaxial interface.

A method for forming heteroepitaxial structure in an embodiment according to the present invention, the method includes dipping a first metal portion having a polycrystalline structure in an electroless plating solution containing a metal ion of a second metal different from the first metal portion, an ion of a halogen element as an oxidizing agent, and a reducing agent, and heteroepitaxial growing a metal reduced from a metal ion of the second metal by a surface limited redox replacement corresponding to the reduced surface of at least one crystalline grain of the first metal portion while reducing the surface of the first metal portion by the oxidizing agent and the reducing agent.

A nanogap electrode in an embodiment according to the present invention includes a first electrode and a second electrode each including a first metal portion having a polycrystalline structure and a second metal portion on the first metal portion, the first metal portion has a linear pattern having a width of 20 nm or less, the second metal portion is disposed at least on one end of the linear pattern of the first metal portion, the second metal portion has an island-shaped structure on the first metal portion, and forming a heteroepitaxial interface corresponding to at least one crystalline grain exposed to a surface of the first metal portion; and a distance between the second metal portion on the first electrode and the second metal portion on the second electrode is 5 nm or less.

A nanogap electrode in an embodiment according to the present invention includes a first electrode and a second electrode each including a first metal portion having a polycrystalline structure and a second metal portion on the first metal portion, the first metal portion has a linear pattern having a width of 15 nm or less, the second metal portion continuously covers a surface of the first metal portion, the second metal portion includes a region for forming a heteroepitaxial interface corresponding to exposed crystalline grains on the surface of the first metal portion, one end of each of the first electrode and the second electrode is arranged facing each other with a gap, and a length of the gap is 5 nm or less.

DESCRIPTION OF EMBODIMENTS

Hereinafter, embodiments of the present invention will be described with reference to the drawings and the like. The present invention may be carried out in various embodiments, and should not be construed as being limited to any of the following embodiments. In order to make the description clearer, the drawings may be schematically represented in terms of the width, thickness, shape and the like of each part as compared with the actual aspect, but this is merely an example and is not intended to limit the interpretation of the present invention. In the present description and the drawings, the same reference signs (or numerals followed by a, b, etc.) are added to the same elements as those described above with respect to the drawings mentioned above, and the detailed description may be omitted as appropriate. Furthermore, the letters appended "first" and "second" for each element are expedient signs used to distinguish each element and have no further meaning unless otherwise explained.

First Embodiment

In the present embodiment, the configuration, and the forming process of a heteroepitaxial structure will be described in detail.

1. Heteroepitaxial Structure

Figure 1:
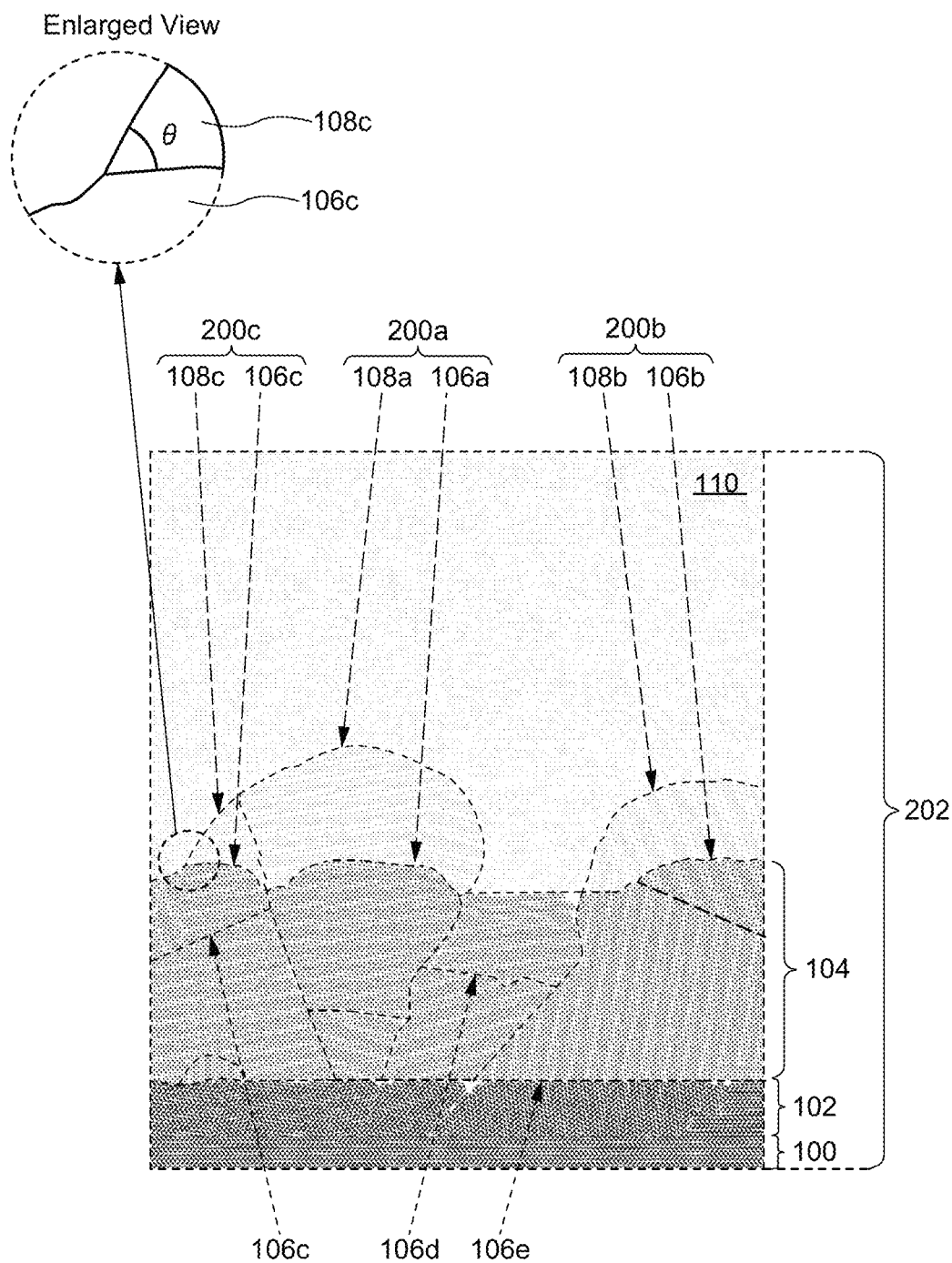
FIG. 1 is a cross-sectional view showing the concept of a heteroepitaxial structure and a metal stack having heteroepitaxial structure according to an embodiment of the present invention.

FIG. 1 shows a cross-sectional view showing an example of a heteroepitaxial structure 200 (200a, 200b, 200c) according to an embodiment of the present invention and an example of a metal stack 202 having the heteroepitaxial structure. FIG. 1 is a conceptual diagram showing a cross-section of the heteroepitaxial structure 200 prepared by electroless gold plating according to an embodiment of the present invention, which is created on the basis of a secondary electron image of atomic resolution by scanning electron microscope (SEM). Electroless plating according to an embodiment of the present invention will be described in detail in the present embodiment and Example 1.

FIG. 1 shows a first metal portion 104 and a second metal portion 108 (108a, 108b, 108c). The first metal portion 104 is a polycrystalline body and contains a plurality of crystalline grains 106 (106a to 106e). The plurality of crystalline grains 106 (106a to 106e) forms crystalline planes oriented in specific directions on the surface of the first metal portion 104. The second metal portion 108 is provided corresponding to at least one of the crystalline grains 106 (106a to 106e). For example, the second metal portion 108a corresponds to the crystalline grain 106a, the second metal portion 108b corresponds to the crystalline grain 106b, and the second metal portion 108c corresponds to the crystalline grain 106c.

The second metal portion 108 (108a, 108b, 108c) is a region heteroepitaxially grown on the surface of the first metal portion 104 and have crystallinity. For example, the second metal portion 108a is formed corresponding to at least one crystalline grain 106a among the plurality of crystalline grains 106a to 106e of the first metal portion 104 and has a state in which the crystalline structure of the crystalline grain 106a is maintained and the lattice continuity is maintained. That is, when the crystalline grain 106a is oriented in a specific direction, the second metal portion 108a contains a crystal oriented in the same orientation. The second metal portion 108a heteroepitaxially grown from the crystalline grain 106a can form a single crystal, and thus can be referred to as a single crystal region. The second metal portion 108a and the crystalline grain 106a form a heteroepitaxial interface. The same applies to the second metal portion 108b and the second metal portion 108c, and a heteroepitaxial interface is formed with the crystalline grains 106b, 106c, respectively. As described above, the heteroepitaxial structure 200a is configured to include the crystalline grain 106a and the second metal portion 108a of the first metal portion 104, the heteroepitaxial structure 200b is configured to include the crystalline grain 106b and the second metal portion 108b of the first metal portion 104, and the heteroepitaxial structure 200c is configured to include the crystalline grain 106c and the second metal portion 108c of the first metal portion 104.

The second metal portion 108 has a nanoscale island-shaped structure on the surface of the first metal portion 104. In other words, the second metal portion 108 can also be said to have a mountain shape or hemispherical shape in a cross-sectional view. In the present embodiment, the nanoscale island-shaped structure refers to an individual having a size of about 50 nm or less as described later, and the appearance shape is a mountain shape or a hemispherical shape, which is used in the meaning of being distinguished from a spherical shape. The appearance shape is a mountain shape, or a hemispherical shape means a shape such that the horizontal cross-sectional area of the second metal portion 108 is reduced toward the upper end from the contact surface with the crystalline grains 106. In addition, the hemispherical shape refers to a spherical surface in which curved surface continues and is not limited to a true spherical surface. As shown in an enlarged view of a region surrounded by a dotted circle in FIG. 1, the second metal portion 108c has a contact angle θ with respect to the surface of the crystalline grain 106c of less than 90 degrees, and heteroepitaxially grows in a highly wettable state, thereby forming a smooth mountain shape or hemispherical shape protrusion.

The size of the second metal portion 108 (108a, 108b, 108c) having the nanoscale island-shaped structure has a width of 50 nm or less, preferably 20 nm or less, and more preferably 10 nm or less from one end to the other end in a plan view (when the first metal portion 104 is viewed from the top surface). The height of the second metal portion 108 (108a, 108b, 108c) from the surface of the first metal portion 104 has a size of 40 nm or less, preferably 20 nm or less. The second metal portion 108 (108a, 108b, 108c) has such a size and is provided apart from each other while maintaining a crystalline structure on the first metal portion 104.

In order for the second metal portion 108 to heteroepitaxially grows on the surface of the crystalline grain 106, the lattice must be matched. The ratio of the lattice mismatch between the lattice constant of the crystalline grain 106 and the lattice constant of the second metal portion 108 is desired 4% or less, preferably 1% or less.

In this embodiment, platinum (Pt) is exemplified as a suitable metal material for forming the first metal portion 104. As a suitable metal material for forming the second metal portion 108, gold (Au) is exemplified. The lattice constant of platinum (Pt) exemplified as the first metal portion 104 is 0.39231 nm, and the lattice constant of gold (Au) exemplified as the second metal portion 108 is 0.407864 nm. Since the lattice mismatch ratio (misfit ratio) of platinum (Pt) to gold (Au) is 3.9%, it is possible to heteroepitaxially grow the second metal portion 108 formed of gold (Au) on the surface of the crystalline grain 106 formed of platinum (Pt). For example, if the plane orientation of the crystalline grain 106 is (111), crystals in which the second metal portion 108 also has the same plane orientation.

Further, the first metal portion 104 may have solid solubility in gold (Au), which is the second metal portion 108, and in such a case, the second metal portion 108 can be heteroepitaxially grown while forming a solid solution at the interface between the first metal portion 104 and the second metal portion 108. Therefore, in addition to platinum (Pt), transition elements such as palladium (Pd), rhodium (Rh), ruthenium (Ru), osmium (Os), and iridium (Ir) can be applied as the first metal portion 104.

FIG. 1 shows an embodiment in which the second metal portion 108a and the second metal portion 108c are formed adjacent to each other and the second metal portion 108b is formed apart from them. In a portion where the second metal portion 108a and the second metal portion 108c are adjacent to each other, it is considered that the second metal portion 108a having a larger volume starts the heteroepitaxial growth first. That is, it is considered that nucleation occurs first in the portion of the crystalline grain 106a, and nucleation occurs later in the portion of the crystalline grain 106c. It is considered that the second metal portion 108a grows in a longitudinal direction (thickness direction) and transverse direction (width direction) in the heteroepitaxial growth process. In this growing process, it is confirmed that the second metal portion 108a spreads to the region of the crystalline grain 106c adjacent to the crystalline grain 106a beyond the grain boundary between the crystalline grains, and the grain boundary is formed at the boundary with the second metal portion 108c.

It is considered that the existence of the grain boundary between the second metal portion 108a and the second metal portion 108c is caused by the fact that the crystalline grain 106a and the crystalline grain 106c of the first metal portion 104 have different crystal axes in addition to the fact that both of them grow individually. Therefore, it is considered that a grain boundary that extends the grain boundary between the crystalline grains 106a, 106c is generated between the heteroepitaxially grown second metal portion 108a and the second metal portion 108c. This means that heteroepitaxial growth is performed on the surface of the first metal portion 104 formed of a polycrystal.

FIG. 1 also shows a state in which the second metal portion 108a and the second metal portion 108b are provided apart from each other. In other words, FIG. 1 shows a state in which the surface of the crystalline grain 106d is not heteroepitaxially grown. This indicates that nucleation occurs discretely and that heteroepitaxial growth is a mode of island-shaped growth rather than layered growth.

FIG. 1 shows another heteroepitaxial structure 200b separated from the heteroepitaxial structure 200a. The heteroepitaxial structure 200b contains the crystalline grain 106b of the first metal portion 104 and the second metal portion 108b, and the configuration thereof is the same as that of the heteroepitaxial structure 200a.

In the heteroepitaxial structure 200 according to the present embodiment, by providing the second metal portion 108 forming a heteroepitaxial interface with the crystalline grains 106, the adhesion is enhanced, and it is possible to reduce the contact resistance.

2. Platinum (Pt)\Gold (Au) Heteroepitaxial Structure

Figure 2A:
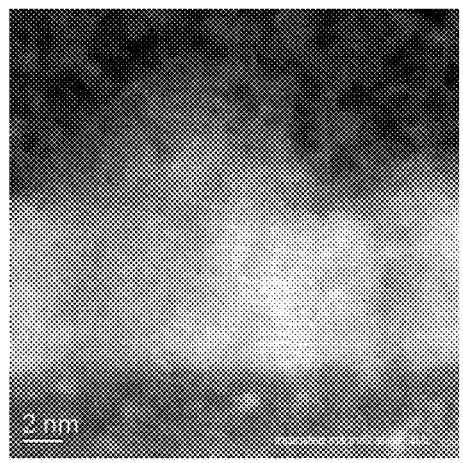
FIG. 2A shows a result of observing a heteroepitaxial structure according to an embodiment of the present invention by a scanning transmission electron microscope and shows a secondary electron image of atomic resolution.
Figure 2B:
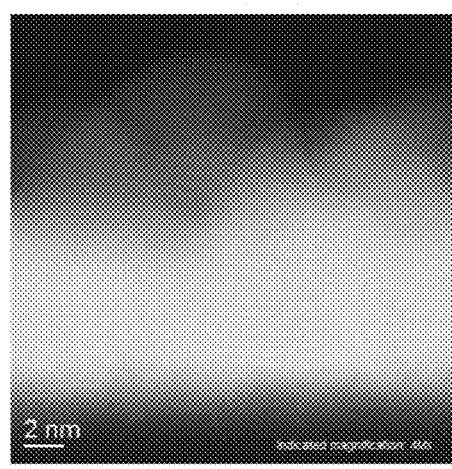
FIG. 2B shows a result of observing a heteroepitaxial structure according to an embodiment of the present invention by a scanning transmission electron microscope and shows a TEM dark field image.
Figure 2C:
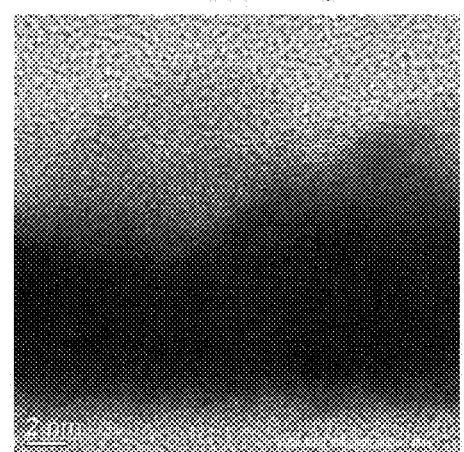
FIG. 2C shows a result of observing a heteroepitaxial structure according to an embodiment of the present invention by a scanning transmission electron microscope and shows a TEM bright field image.

FIG. 2A, FIG. 2B, and FIG. 2C show results of observing a heteroepitaxial structure prepared using a platinum (Pt) film having a polycrystalline structure as the first metal portion 104 and gold (Au) as the second metal portion 108.

FIG. 2A shows a secondary electron image of atomic resolution by SEM observation in a scanning transmission electron microscope, FIG. 2B shows a dark field image by a transmission electron microscope (TEM) observation, FIG. 2C shows a bright field image by TEM. The sample observed here was obtained by stacking a titanium (Ti) film having a thickness of 2 nm and a platinum (Pt) film having a thickness of 9 nm on silicon oxide ($SiO_2$) and growing gold (Au) by electroless plating according to the present embodiment, which will be described later. FIG. 2A, FIG. 2B, and FIG. 2C show the results of cross-sectional observations of a sample of such structures sliced by a focused ion beam to a depth of about 60 nm.

In the TEM dark field image of FIG. 2B and the TEM bright field image of FIG. 2C, striped structures are observed in platinum (Pt). The direction of the stripes observed here varies from place to place, confirming that platinum (Pt) has a polycrystalline structure. From the secondary electron image of atomic resolution in FIG. 2A, it is observed that the striped structures observed in the platinum (Pt) region extend to the gold (Au) region. From this, it is understood that the gold (Au) on the platinum (Pt) film is heteroepitaxially grown on the basis of the crystalline structure (striped structure) of the underlying platinum (Pt).

In addition, the gold (Au) is heteroepitaxially grown in the depth direction, because the striped structure in the transmission electron microscope image of the TEM dark field image of FIG. 2B and the TEM bright field image of FIG. 2C match with the SEM secondary electron image showing the state of the cross-sectional surface. The gold (Au) grown region, as shown schematically in FIG. 1, is grown to form a protrusion in nanoscale island-shaped structures (or mountain shape or hemispherical shape). The gold (Au) is spread on the surface of the crystalline grains of platinum (Pt), and it is observed that the angle formed by the platinum (Pt) film surface and the gold (Au) surface is 90 degrees or less. From this fact, it is observed that the gold (Au) grown by the electroless plating according to the present embodiment forms a protrusion of island-shaped structures (or mountain shape or hemispherical shape) in which the foot expands in a state of being wet on the platinum (Pt) surface.

3. Metal Stack Having Heteroepitaxial Structure

Next, a metal stack having heteroepitaxial structure. A metal stack having heteroepitaxial structure is configured to include a first metal portion, a second metal portion, and a third metal portion, as described below.

3-1. Configuration of Metal Stack Having Heteroepitaxial Structure

FIG. 1 also shows the metal stack 202 having heteroepitaxial structure. The metal stack 202 having heteroepitaxial structure has on the first metal portion 104, a configuration in which a third metal portion 110 is provided to cover the second metal portion 108. Since the second metal portion 108 is a region heteroepitaxially grown from the crystalline grains 106, the metal stack 202 having a heteroepitaxial structure can also be considered to have a structure that the third metal portion 110 is provided to cover the heteroepitaxial structure 200a and the heteroepitaxial structure 200b.

The metal stack 202 having heteroepitaxial structure is configured to include a plurality of heteroepitaxial structures 200. The metal stack 202 having heteroepitaxial structure includes a plurality of second metal portions 108 provided apart from each other between the first metal portion 104 and the third metal portion 110. As described with reference to FIG. 1, the second metal portion 108 is a portion that has heteroepitaxially grown corresponding to the crystalline grain 106 contained in the first metal portion 104 and each has an isolated island-shaped structure.

The third metal portion 110 is formed of the same or different metal material as the second metal portion 108. For example, when the second metal portion 108 is formed of gold (Au), the third metal portion 110 may be formed of gold (Au), which is the same kind of metal material. The third metal portion 110 can also be formed using, for example, platinum (Pt) as a metal material different from gold (Au). Further, the third metal portion can be formed using an alloy such as gold or a palladium alloy. The third metal portion 110 may have a crystalline structure or an amorphous structure. For example, the third metal portion 110 may be a polycrystalline body crystal grown with the second metal portion 108 as a core or may have an amorphous structure regardless of the base surface.

In the metal stack on which the metal layer is formed, there is a problem of peeling that occurs at the interface between the metal layer of the upper side and the metal layer of the lower side. Here, since the second metal portion 108 forms the heteroepitaxial interface with the crystalline grain 106 of the first metal portion 104 and is dispersedly arranged on the surface of the first metal portion 104, the third metal portion 110 has a region in contact with the first metal portion 104 and a region in contact with the second metal portion 108.

When the third metal portion 110 is formed of the same metal material as the second metal portion 108, it is expected that high adhesion can be obtained from the affinity of the material. Even when the third metal portion 110 is formed of a metal material different from that of the second metal portion 108, it is possible to select a metal having high adhesion to the second metal portion 108. Even if the adhesion between the first metal portion 104 and the third metal portion 110 is poor (when the adhesive force is small), by increasing the adhesion between the second metal portion 108 and the third metal portion 110, it is possible to prevent peeling of the third metal portion 110 laminated on the first metal portion 104. Thus, by increasing the adhesion between the third metal portion 110 and the second metal portion 108, the third metal portion 110 is prevented from peeling off from the first metal portion 104, it is possible to reduce the contact resistance.

That is, since the second metal portion 108a constituting the heteroepitaxial structure 200a forms a heteroepitaxial interface with the crystalline grain 106a, the continuity of the crystalline structure is maintained and is in a structurally stable state. Therefore, the contact resistance can be reduced by increasing the adhesion of the third metal portion 110 to the first metal portion 104 by using a metal material having high adhesion to the second metal portion 108 as the third metal portion 110. In other words, by providing the third metal portion 110 so that the second metal portion 108 protrudes into the third metal portion 110, an anchor effect is exhibited, it becomes difficult to peel off from the first metal portion 104, and it is possible to reduce the contact resistance.

In order to improve the adhesion of the third metal portion 110 to the first metal portion 104, it is preferable that the plurality of second metal portions 108 are dispersedly arranged in the plane of the first metal portion 104. For example, it is preferable that the second metal portion 108 is dispersedly arranged in the plane of the first metal portion 104 at a density of not less than 50/μm² and not more than 2000/μm² per unit area. The ratio of the total area of the second metal portion 108 in contact with the first metal portion 104 with respect to the surface area of the first metal portion 104 is preferably 0.1 (10%) or more and 0.8 (80%) or less. By the second metal portion 108 at such a density is disposed in the plane of the first metal portion 104, the metal stack 202 having heteroepitaxial structure increases the adhesion between the first metal portion 104 and the third metal portion 110, it is possible to reduce the contact resistance.

As shown in FIG. 1, the metal stack 202 having heteroepitaxial structure is provided on a substrate 100. A base metal layer 102 may be provided between the substrate 100 and the first metal portion 104. The base metal layer 102 is not an indispensable structure and is provided to improve the adhesion between the first metal portion 104 and the substrate 100 and to reduce the contact resistance. The base metal layer 102 is preferably formed using a metal material such as titanium (Ti), chromium (Cr), or nickel (Ni), when the first metal portion 104 is formed of a platinum (Pt) film. The substrate 100 may be a silicon substrate (silicon wafer), silicon oxide (SiO₂) film or silicon nitride (Si₃N₄) film on the silicon substrate, an SOI (Silicon on Insulator) substrate, a sapphire substrate, an yttria-stabilized zirconia (YSZ) substrate, or the like.

3-2. Contact Resistance of Metal Stack Having Heteroepitaxial Structure

The metal stack 202 having heteroepitaxial structure includes the heteroepitaxial structures 200a, 200b, and the third metal portion 110 is laminated. The third metal portion 110 is provided to cover the second metal portion 108 of the top surface of the first metal portion 104. The third metal portion 110 and the second metal portion 108 are formed of the same or different metal material, but when at least the second metal portion 108 is formed of gold (Au), the contact resistance with the third metal portion 110 is reduced. Therefore, it can be considered that the effect of contact resistance between the second metal portion 108 and the third metal portion 110 on the overall contact resistance is low, in the metal stack 202 having the heteroepitaxial structure including the structure in which the first metal portion 104 and the third metal portion 110 are stacked.

On the other hand, the third metal portion 110 has an interface in contact with the first metal portion 104. That is, the first metal portion 104 includes two interfaces. One is a heteroepitaxial interface formed between the second metal portion 108, and the other is a physical contact interface with the third metal portion 110. Since the first metal portion 104 and the second metal portion 108 forming the heteroepitaxial interface form a metallic bond, the contact resistance is extremely low. On the other hand, since platinum oxide (PtO or Pt₂O) is formed on the surface of platinum (Pt) forming the first metal portion 104, the first metal portion 104 and the third metal portion 110 are physically contacted without forming a metal bond.

The interface where the first metal portion 104 and the third metal portion 110 are physically in contact with each other is also a factor in lowering the adhesion. Further, the electric conductivity of the portions where the first metal portion 104 and the third metal portion 110 are physically in contact with each other is caused by tunneling effects, since the platinum oxide (PtO or Pt₂O) covering the surface of the platinum (Pt) is an insulator. A part of the interface at which the first metal portion 104 and the third metal portion 110 are physically in contact with each other has a region in which platinum (Pt) of the first metal portion 104 is exposed, and when the third metal portion 110 is formed of gold (Au), platinum (Pt) and gold (Au) make ohmic contact with each other to form a low resistance contact region.

In the metal stack 202 having heteroepitaxial structure, when comparing the resistance per unit area of the physical contact interface in which the first metal portion 104 and the third metal portion 110 are turned ohmic contact and the heteroepitaxial interface formed by the first metal portion 104 and the second metal portion 108, the heteroepitaxial interface resistance is about one order of magnitude lower. The ratio of the physical contact interface in ohmic contact to the physical contact interface depends on the forming process of the metal stack.

In the metal stack 202 having platinum (Pt) \ gold (Au) heteroepitaxial structure, resistance Rt between the platinum (Pt) layer forming the first metal portion 104 and the gold (Au) forming the second metal portion 108 is, as shown in Equation (1), the sum of resistance R1 of the first metal portion 104 (Pt film), contact resistance Rc at the heteroepitaxial interface of the above, and resistance R2 of the second metal portion 108 (Au).

$$R_t = R_1 + R_c + R_2$$

$$R_1 = \rho_1 d_1 / S$$

$$R_2 = \rho_2 d_2 / S \quad R_j = \rho_{j0}/(S \times a)$$

$$R_p = \rho_{p0}/(S \times (1-a))$$

$$R_c = R_j R_p / (R_j + R_p) \qquad (1)$$

$\rho_1$: Volume resistivity ($1.04 \times 10^{-7}$ Ωm) of the first metal portion 104 (Pt), $d_1$: Thickness of the first metal portion 104 (Pt), S: Volume resistivity ($2.44 \times 10^{-8}$ Ωm) of gold (Au), $d_2$: Thickness of the second metal portion 108 (Au), $\rho_{j0}$: resistance (unit: Ωm²) per unit area of the heteroepitaxial interface), $\rho_{p0}$: resistance (unit: Ωm²) per unit area of the physical contact interface, a: The area ratio of the heteroepitaxial interface formed by the first metal portion 104 (Pt) and the second metal portion 108 (Au) in the metal stack, 1-a: The area ratio of the physical contact interface, $R_j$; the contact resistance, $R_p$: the contact resistance of the physical contact interface. The volume resistivity of platinum (Pt) is about 4.3 times greater than the volume resistivity of gold (Au). Resistance value is proportional to the film thickness and inversely proportional to the area.

Comparing the resistance per unit area $\rho_2 d_2$ of the second metal portion when the thickness of the second metal portion 108 is set to 1 μm, the resistance per unit area $\rho_{p0}$ of the physical contact interface portion, and the resistance per unit area $\rho_{j0}$ of the heteroepitaxial interface is $\rho_{p0} > \rho_2 d_2 > \rho_{j0}$. The ratio of the physical contact interface under ohmic contact at the physical contact interface depends on the process of making the metal stack, but $\rho_{p0}$ is a value about 2 to 100 times that of $p_2 d_2$ (1 μm thickness). $p_{j0}$ is 0.1 times or less of $p_2 d_2$.

Figure 3:
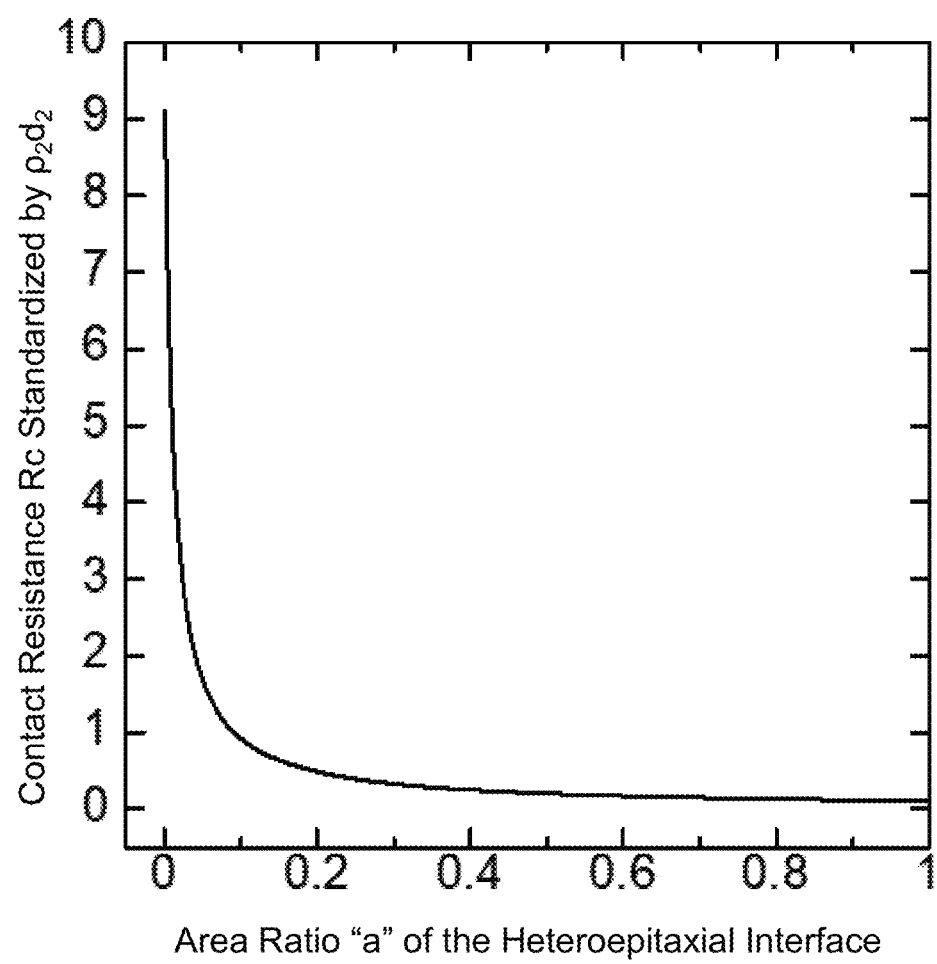
FIG. 3 is a graph showing an area ratio dependency of the heteroepitaxial interface of the contact resistance in a metal stack having heteroepitaxial structure according to an embodiment of the present invention.

Since the contact resistance $R_c$ is a parallel connection between the contact resistance $R_j$ at the heteroepitaxial interface and the contact resistance $R_p$ at the physical contact interface, it is preferable to increase the area ratio a ($0 \le a < 1$) of the heteroepitaxial interface to reduce the contact resistance $R_c$. FIG. 3 is a graph showing the area ratio dependence a of the heteroepitaxial interface of the contact resistance $R_c$ standardized by $p_2 d_2$ when $\rho_{p0} = 10 p_2 d_2$, $\rho_{j0} = 0.1 p_2 d_2$ are assumed. As the area ratio a of the heteroepitaxial interface increases from 0, the contact resistance drops rapidly, drops to $p_2 d_2$ at a=0.08 (8%), and gradually decreases toward $p_{j0}(=0.1 p_2 d_2)$ as the value of a further increases. Thus, since the contact resistance tends to decrease corresponding to the area ratio a of the heteroepitaxial interface, the value of a is desired to be 0.1 or more, more preferably 0.2 or more, and even more preferably 0.5 or more.

4. Method for Forming Heteroepitaxial Structure

A heteroepitaxial structure according to an embodiment of the present invention is formed using electroless plating. Hereinafter, a method for forming the same will be described in detail.

The second metal portion 108 dispersed on the surface of the first metal portion 104 can be formed by electroless plating. When platinum (Pt) is used as the first metal portion 104, the second metal portion 108 can be formed by electroless gold plating. No examples of heteroepitaxial growth of gold (Au) on platinum (Pt) surfaces by electroless gold plating have been reported. Non-Patent Literature 1 discloses a technique of growing gold (Au) on platinum (Pt) by electrolytic plating, but gold (Au) is grown in a layer form on platinum (Pt), and a structure in which heteroepitaxial structures are dispersedly arranged like the second metal portion 108 shown in the present embodiment has not been confirmed.

Considering the heteroepitaxial structure 200 shown in the present embodiment, when gold (Au) having a nanoscale radius of curvature is heteroepitaxially grown on the surface of platinum (Pt), it is considered that very large surface tension is generated on the surface of gold (Au), which is proportional to the reciprocal of the radius of curvature. In the electroless gold plating according to the present embodiment, it is considered that the platinum oxide (PtO) formed on the platinum (Pt) surface is reduced to form the platinum (Pt) surface, and gold ion (Au+, Au³⁺) is reduced by surface limited redox replacement (SLRR) in the presence of this large surface tension, and heteroepitaxially grows. In other words, it is considered that, on the surface of the platinum (Pt) film, a reduction reaction of platinum oxide (PtO) occurs as shown by Formula (2).

$$PtO + 2H^+ + 2e^- \rightarrow Pt + H_2O \qquad (2)$$

Then, the process in which gold (Au) grows on the reduced platinum (Pt) surface can be shown by surface limited redox replacement of platinum (Pt) and gold (Au) as in Formula (3).

$$Pt + 2Au^+ + H_2O \rightarrow PtO + 2Au + 2H^+ \qquad (3)$$

Details of electroless gold plating capable of heteroepitaxially growing gold (Au) on platinum (Pt) will be described below.

4-1. Production of First Metal Portion

As described with reference to FIG. 1, the first metal portion 104 is formed on the substrate 100. The base metal layer 102 may be provided between the substrate 100 and the first metal portion 104. The first metal portion 104 and the base metal layer 102 can be formed by a sputtering method, an electron beam evaporation method, an atomic-layer deposition (ALD) method, or a chemical vapor deposition (CVD) method.

As the substrate 100, for example, a silicon wafer on which a silicon oxide film is formed is used. In the first metal portion 104, a platinum (Pt) film having a polycrystalline structure is formed to a thickness of 5 nm to 20 nm by a sputtering method. A titanium (Ti) film having a thickness of 2 nm to 10 nm may be formed as the base metal layer 102 between the substrate 100 and the first metal portion 104.

4-2. Electroless Gold Plating Solution

Electroless plating is classified into a substitution type in which metal ions in an electroless plating solution are reduced by electronics liberated by dissolution of a base metal to precipitate on an electrode, and an autocatalytic type in which a reducing agent is oxidized on an electrode and metal ions are reduced by the liberated electrons to precipitate as a metal layer.

An electroless gold plating solution used in the present embodiment is classified into an autocatalytic type, and a solution containing gold ions (Au+, Au³⁺) ions of a halogen element as an oxidizing agent, and a reducing agent is used. In order to heteroepitaxially grow gold (Au) on platinum (Pt) by electroless gold plating, it is necessary to reduce the platinum oxide (PtO) existing on the platinum (Pt) surface. In the present embodiment, an appropriate one is selected as a combination of the ion of a halogen element and the reducing agent to express this reduction action. In addition, by including an excessive amount of the reducing agent, gold (Au) is precipitated by being rate-limiting by a reduction reaction. Further, such an electroless gold plating solution is diluted with a large amount of pure water to control the reduction rate of gold (Au) so that gold (Au) particles are not precipitated in the electroless plating solution.

Specifically, the present embodiment uses an electroless gold plating solution in which iodine tincture in which gold (Au) is dissolved and L(+)-ascorbic acid ($C_6H_8O_6$) used as the reducing agent are combined. Such an electroless gold plating solution enables heteroepitaxial growth of gold (Au) on the crystal surface of platinum (Pt). It is believed that the electroless gold plate solution contains iodine ions ($I^-$, $I_3^-$) derived from iodine tincture and L(+)-ascorbic acid ($C_6H_8O_6$) to cause a reduction reaction of platinum oxide (PtO or $PtO_2$).

4-3. Electroless Gold Plating Method

The electroless plating is performed by immersing a platinum (Pt) layer as the first metal portion 104 in the electroless gold plating solution. When the platinum (Pt) layer as the first metal portion 104 is immersed in the electroless gold plating solution, nucleation occurs preferentially on the surfaces of the crystalline grains of the platinum (Pt) layer, and gold (Au) reduced from gold ions (Au+, Au$^{3+}$) grows. The electroless gold plating solution is diluted to 100 times, preferably 500 times or more, and more preferably 1000 times or more with pure water as described above. The electroless plating solution contains an excessive amount of the reducing agent.

Since the electroless gold plating solution according to the present embodiment contains an excessive amount of the reducing agent in the undiluted solution, gold (Au) ions are reduced from trivalent gold ions (Au$^{3+}$) to monovalent gold ions (Au$^+$).

Reduction potential (based on standard hydrogen electrode, 25° C., 105 Pa) from a monovalent gold ion (Au$^+$) to gold (Au) or a trivalent gold ion (Au$^{3+}$) to a monovalent gold ion (Au$^+$) is as follows.

$$Au^+ + e^- \rightarrow Au: 1.82V$$

$$Au^{3+} + 2e^- \rightarrow Au^+: 1.41\ V$$

$$Au^{3+} + 3e^- \rightarrow Au: 1.52\ V$$

The reduction potential from a platinum ion (Pt) to platinum (Pt) is as follows.

$$Pt^{2+} + 2e^- \rightarrow Pt: 1.188\ V$$

When a trivalent gold ion (Au$^{3+}$) is reduced to a monovalent gold ion (Au$^+$), the reduction potential to gold (Au) is increased, and a monovalent gold ion (Au$^+$) is less likely to be reduced than a trivalent gold ion (Au$^{3+}$). By diluting with pure water, iodine (I$_2$) which is hardly soluble in pure water is equilibrated to an easily soluble iodine ion (I$^-$, I$_3^-$), and the ratio of iodine ions for iodine becomes high.

Since the iodine ion have a function of etching gold (Au), the excess of the reducing agent has an effect of suppressing the etching. Compared to the reduction potential (1.188 V) of a platinum ion (Pt$^{2+}$), the reduction potentials of a trivalent gold ion (Au$^{3+}$) and a monovalent gold ion (Au$^+$) are as high as 1.52 V and 1.82 V, respectively, and are not easily reduced. The excess reducing agent is effective to promote the surface limited redox replacement of platinum and gold by its reduction action.

The electroless gold plating solution according to the present embodiment is diluted 100 times or more, preferably 500 times or more with pure water, so that gold grows heteroepitaxially on the platinum film of the first metal portion 104 and forms the second metal portion 108. If the dilution ratio is small, the growth rate of the electroless gold plating increases, heteroepitaxial growth cannot be performed, nuclei are generated in the plating bath to grow as gold nanoparticles, and the possibility that the gold nanoparticles are physically adsorbed on the platinum film surface of the first metal portion increases, which is not preferable. At the time of the 1000-fold dilution, a plating rate is obtained that allows gold to grow heteroepitaxially on the platinum film of the first metal portion 104 to form the second metal portion 108. In the present plating, the dilution ratio of pure water is important because the growth rate of the plating is controlled by the dilution ratio as described above.

The platinum (Pt) layer as the first metal portion 104 immersed in the electroless plating solution heteroepitaxially grows gold (Au) on the surface as described above, and the gold ions (Au$^+$, Au$^{3+}$) are reduced and precipitated in the electroless gold plating solution and are taken out from the electroless gold plating solution before it deposits on the surface of the first metal portion 104. By repeating such a process at least once, preferably a plurality of times, a gold (Au) region as the second metal portion 108 is formed. The immersion time is appropriately set according to the concentration and temperature of the electroless gold plating solution. For example, the time for each immersion of the first metal portion 104 in the electroless gold plating solution is controlled to be 3 seconds to 30 seconds, for example, 10 seconds.

Specifically, the electroless gold plating solution in which iodine tincture in which gold (Au) is dissolved is combined with L(+)-ascorbic acid (C$_6$H$_8$O$_6$) used as a reducing agent reduces platinum oxide (PtO) formed on the surface of the platinum (Pt) film by the reduction reaction expressed by a combination of I$_3^-$ ions derived from iodine tincture and a reducing agent (here, ascorbic acid is used), reduces gold ions (Au$^+$, Au$^{3+}$) by an surface limited redox replacement (SLRR) and oxidizes platinum (Pt) to platinum oxide (PtO), thereby causing the gold (Au) to grow heteroepitaxially on the platinum (Pt) surface.

Gold (Au) atoms adhered to the surface of platinum (Pt) crystalline grains are self-diffused to the surface due to Rayleigh instability and try to become a spherical shape with stable energy and a large radius of curvature. Gold (Au) atoms migrate on the deposited surface and form an energetically stable crystalline state. As a result, a single crystal region of gold (Au) having the nanoscale island-shaped structure (or mountain shape or hemispherical shape) is formed on the surface of platinum (Pt) crystalline grains.

4-4. Pretreatment of Electroless Plating

Before performing the electroless plating, the surface of the first metal portion 104 in the oxidized state may be subjected to a pretreatment for performing a reduction treatment. As the pretreatment, a pretreatment solution containing an oxidizing agent and a reducing agent is used. Specifically, iodine ion (I$^-$, I$_3^-$) derived from iodine tincture is used as the oxidizing agent, and a combination with L(+)-ascorbic acid (C$_6$H$_8$O$_6$) is used as the reducing agent. The pretreatment is performed by immersing the first metal portion 104 in such a pretreatment solution. By this pretreatment, the platinum oxide (PtO) formed on the surface of the first metal portion 104 is reduced, so that the surface of platinum (Pt) can be formed, and the nucleation density can be increased in the electroless plating treatment.

5. Production of Metal Stack Having Heteroepitaxial Structure

As shown in FIG. 1, by forming the third metal portion 110 so as to cover the second metal portion 108 formed on the surface of the first metal portion 104, the metal stack 202 having heteroepitaxial structure is fabricated. The third metal portion 110 is formed by electroless plating, a sputtering method, an electron beam evaporation method, and a vacuum evaporation method or the like. For example, the third metal portion 110 is formed to a thickness of 0.1 μm to 20 μm by using an electroless plating solution different from the electroless plating solution according to the present embodiment. By providing such the third metal portion 110, it is possible to obtain the metal stack 202 having heteroepitaxial structure.

By including the second metal portion 108 which heteroepitaxial grown on the surface of the first metal portion 104, the metal stack having heteroepitaxial structure 202 can increase the adhesion between the first metal portion 104 and the third metal portion 110 so that it prevents peeling and reduces the contact resistance.

Second Embodiment

The present embodiment shows an example of a nanogap electrode having a heteroepitaxial interface. The nanogap electrode means, unless otherwise specified, an electrode having a gap portion (gap) between a pair of electrodes and a gap length of the gap portion (gap length) is 10 nm or less, preferably 5 nm or less.

Figure 8A:
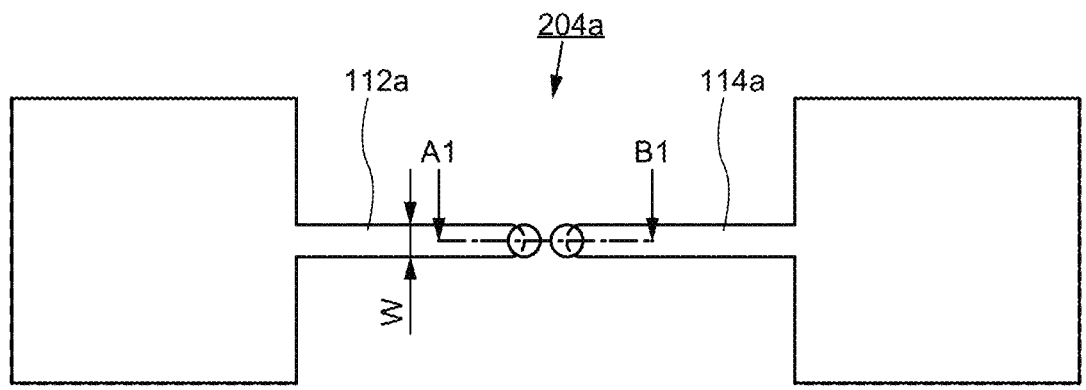
FIG. 8A shows a plan view of nanogap electrodes according to an embodiment of the present invention.

FIG. 8A shows a plan view of a nanogap electrode 204a according to the present embodiment. The nanogap electrode 204a is arranged such that one end of a first electrode 112a and one end of a second electrode 114a face each other with a gap therebetween. The first electrode 112a and the second electrode 114a each include a portion having a linear pattern having a width of 20 nm or less, preferably a width of 10 nm or less in a plan view. The end portion of the linear patterns of the first electrode 112a and the second electrode 114a are arranged to face each other and have a gap of 10 nm or less, preferably 5 nm or less.

Figure 8B:
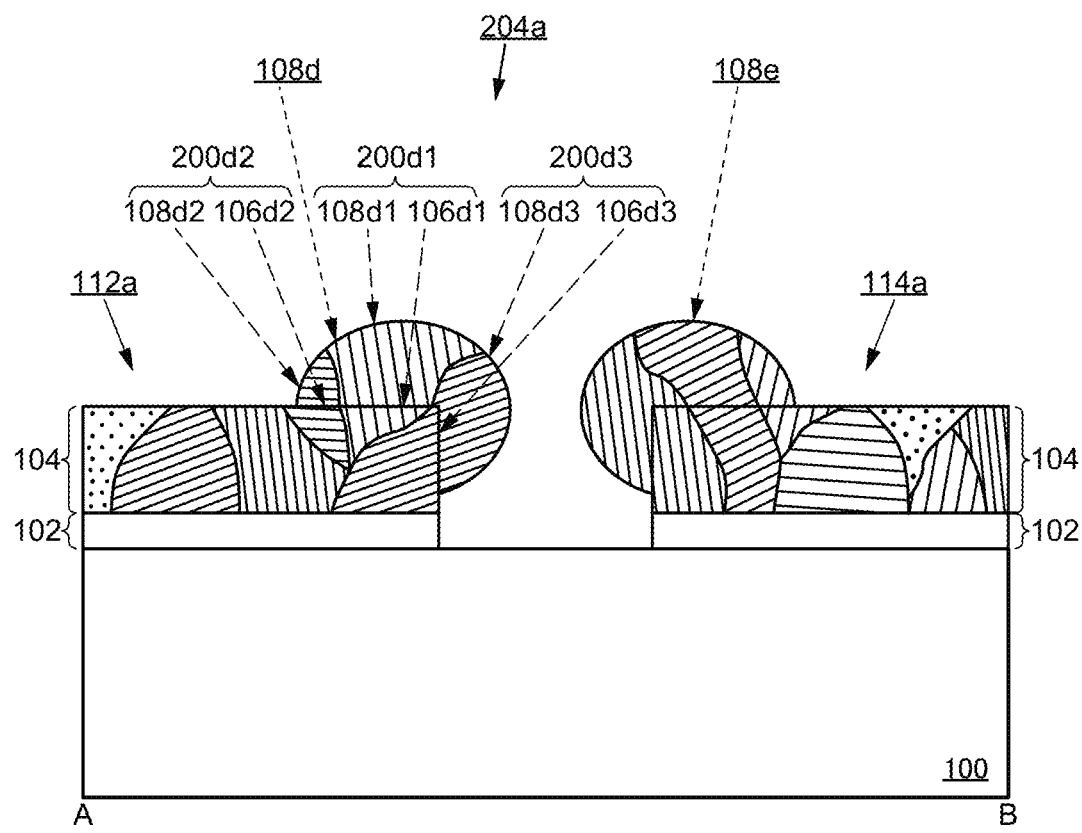
FIG. 8B shows a cross-sectional schematic view corresponding to A1-B2 line of nanogap electrodes according to an embodiment of the present invention.

A cross-sectional structure corresponding to A1-B1 line shown in FIG. 8A is shown in FIG. 8B. The first electrode 112a includes the first metal portion 104 and a second metal portion 108d, and the second electrode 114a includes the first metal portion 104 and a second metal portion 108e. Similar to the first embodiment, a metal material different from the first metal portion 104 and the second metal portions 108d, 108e is used. The first metal portion 104 has a polycrystalline structure and includes the plurality of crystalline grains 106. FIG. 8B schematically shows an example in which the first metal portion 104 of the first electrode 112a contains a plurality of crystalline grains 106d1, 106d2, 106d3. The plurality of crystalline grains 106d1, 106d2, 106d3 form crystalline planes oriented in a specific orientation on the surface of the first metal portion 104.

The second metal portions 108d, 108e are formed by electroless plating as in the first embodiment. The second metal portions 108d, 108e formed by electroless plating have the nanoscale island-shaped structures that can be regarded as one isolated region on the first metal portion 104. In other words, it can be said that the second metal portions 108d, 108e have an appearance shape of mountain shape or hemispherical shape in a cross-sectional view. The size of the second metal portions 108d, 108e having the nanoscale island-shaped structures is a width of 50 nm or less, preferably 20 nm or less, and more preferably 10 nm or less from one end to the other end in a plan view (when the first metal portion 104 is viewed from above). The second metal portions 108d, 108e have such sizes and are provided apart from each other in a state where the crystalline structure is maintained on the first metal portion 104.

As shown in FIG. 8B, the second metal portion 108d includes crystalline regions 108d1, 108d2, 108d3. The crystals region 108d1, 108d2, 108d3 are regions heteroepitaxial grown on the crystalline grains 106d1, 106d2, 106d3 by electroless plating. The crystal region 108d1 forms a heteroepitaxial interface with the crystalline grain 106d1, the crystal region 108d2 forms a heteroepitaxial interface with the crystalline grain 106d2, and the crystal region 108d3 forms a heteroepitaxial interface with the crystalline grain 106d3. In other words, the first electrode 112a includes a heteroepitaxial structure 200d1 formed by the crystal region 108d1 and the crystalline grain 106d1, a heteroepitaxial structure 200d2 formed by the crystal region 108d2 and the crystalline grain 106d2, and a heteroepitaxial structure 200d3 formed by the crystal region 108d3 and the crystalline grain 106d3.

The crystal orientations of the crystalline grains 106d1, 106d2, 106d3 of the first metal portion 104 do not necessarily coincide with each other and are different from each other. Therefore, the crystal orientations of the crystal region 108d1, 108d2, 108d3 of the second metal portion 108d are different from each other. In the early stage of electroless plating, the heteroepitaxially grown crystal regions 108d1, 108d2, 108d3 corresponding to each of the crystalline grains 106d1, 106d2, 106d3 are integrated with the adjacent crystal regions with different crystal orientations while forming crystalline grain boundaries. As a result, the second metal portion 108d including a plurality of crystal regions is formed. Since the second metal portion 108d is grown by electroless plating so that the radius of curvature is as large as possible to reduce the surface tension and assume an energetically stable structure, the surface has a hemispherical smooth shape while including heteroepitaxial structure.

The first electrode 112a has been described above, the same applies to the second electrode 114a. As in the first embodiment, platinum (Pt) is preferably used as the first metal portion 104, and gold (Au) is preferably used as the second metal portions 108d, 108e. A titanium (Ti) film may be provided as the base metal layer 102 between the first metal portion 104 and the substrate 100.

The nanogap electrode 204a has a configuration in which at least the second metal portions 108d, 108e are provided in the end portions of the linear pattern formed by the first metal portion 104. By thinning the width of the linear pattern, the second metal portion 108d of the first electrode 112a and the second metal portion 108e of the second electrode 114a can be arranged so as to face each other on the center line of the linear pattern.

The second metal portion 108d of the first electrode 112a and the second metal portion 108e of the second electrode 114a grow and become large by electroless plating, when the distance between them becomes narrow, a Helmholtz layer (a layer of solvents, solute molecules, and solute ions adsorbed on the surfaces of the electrodes) is formed, and metal ions in the electroless plating solution cannot enter into the gaps. As a result, the plating growth of the opposite region of the second metal portion 108d and the second metal portion 108e is stopped. As described above, in the present embodiment, the gap interval of the nanogap electrode 204a can be precisely controlled by utilizing the self-stop function expressed by the electroless plating.

The gap length controlled by the self-stop function of the electroless plating tends to be narrower as the radius of curvature of the opposite region of the second metal portion 108d and the second metal portion 108e becomes smaller. When the radius of curvature is about 10 nm, the gap length can be controlled to 3 nm, and when the radius of curvature is about 5 nm, the gap length can be controlled to 1 nm or less, for example, 0.7 nm.

The base metal layer 102 is not an indispensable structure in the case of stacked structure and is provided to improve the adhesion between the first metal portion 104 and the substrate 100 and to reduce the contact resistance. On the other hand, in the case of the linear pattern, when the width from one end to the other end becomes 20 nm or less, a part of the base metal layer 102 is diffused into the first metal portion 104 by the surface tension proportional to the reciprocal of the radius of curvature and may exist at the grain boundary of the first metal portion polycrystal. In addition, it may be diffused into the crystal boundaries of the second metal portion 108d including a plurality of crystal regions. The stability of the second metal portion 108d is improved by the segmentation to the plurality of crystal interfaces due to the diffusion of the base metal layer 102. Such diffusion of the base metal layer 102 is not observed in the stacked structure unless subjected to heat treatment.

According to the present embodiment, by growing the second metal portion forming a heteroepitaxial interface on the first metal portion by electroless plating, it is possible to obtain a nanogap electrode having a nanoscale gap length. In this case, by reducing the line width of the linear pattern, the probability that the positions of the second metal portions of the ends of both electrodes forming the gap are on the same axis is increased and the interval of the nanogaps can be controlled precisely.

Third Embodiment

The present embodiment shows an example in which the form of the second metal portion is different from that of the second embodiment in the nanogap electrode having heteroepitaxial structure.

Figure 9A:
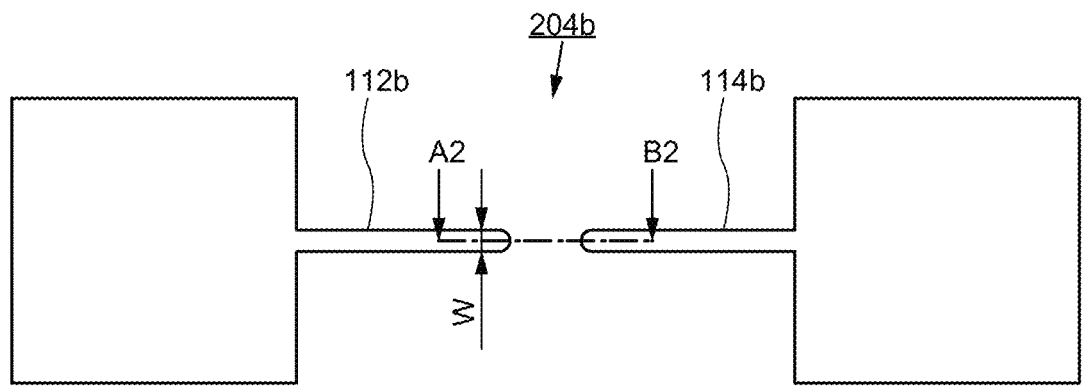
FIG. 9A shows a plan view of nanogap electrodes according to an embodiment of the present invention.

FIG. 9A shows a plan view of a nanogap electrode 204b according to the present embodiment. In the nanogap electrode 204b, one end of the first electrode 112b and one end of the second electrode 114b are arranged to face each other with a gap. The first electrode 112b and the second electrode 114b include portions having linear patterns of 20 nm or less, preferably 10 nm or less, in a plan view. The end portion of the linear patterns of the first electrode 112b and the second electrode 114b are arranged to face each other, and a gap of 10 nm or less, preferably 5 nm or less is provided.

Figure 9B:
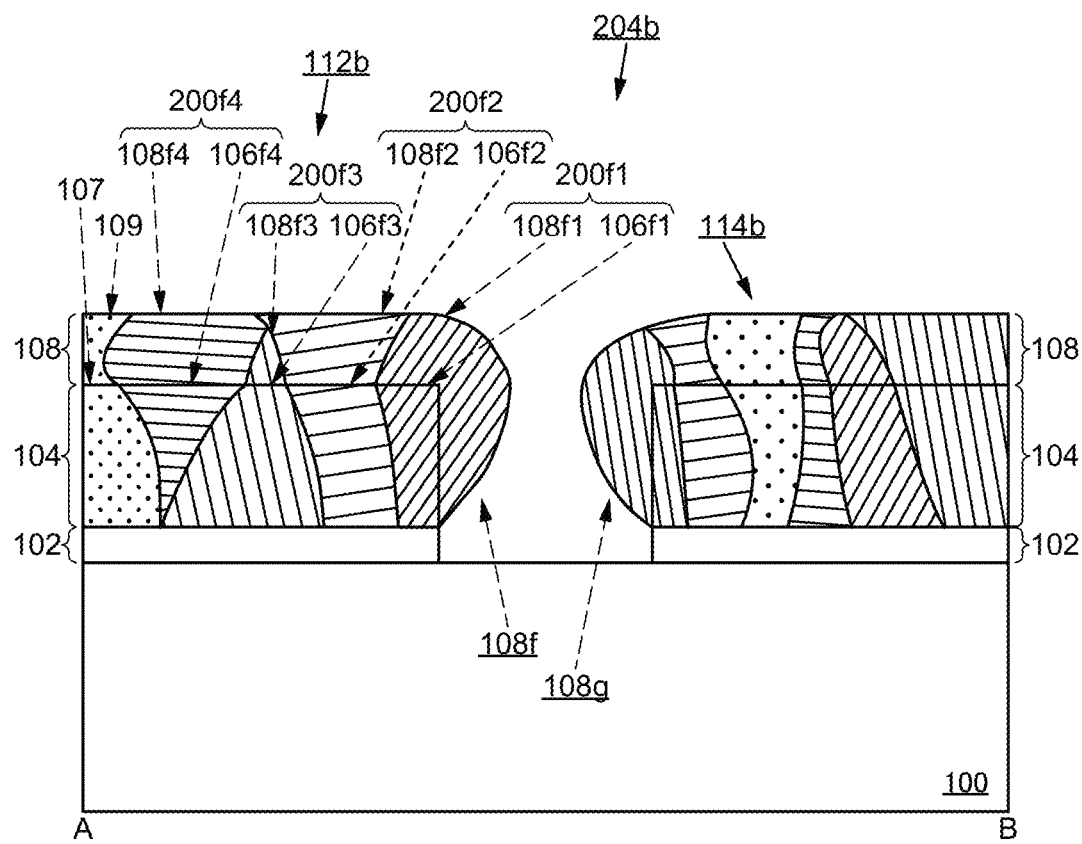
FIG. 9B shows a cross-sectional schematic view corresponding to line A-B of nanogap electrodes according to an embodiment of the present invention.

FIG. 9B shows the cross-sectional structure corresponding to line A2-B2 shown in FIG. 9A. The first electrode 112b includes the first metal portion 104 and a second metal portion 108f, and the second electrode 114b includes the first metal portion 104 and a second metal portion 108g. Different metal materials are used for the first metal portion 104 from the second metal portion 108f, and the second metal portion 108g. The first metal portion 104 has a polycrystalline structure and includes the plurality of crystalline grains 106. FIG. 9A shows an embodiment in which the first electrodes 112b include crystalline grains 106f1, 106f2, 106f3, 106f4. Each of the plurality of crystalline grains 106 forms crystalline planes oriented in a specific orientation on the surface of the first metal portion 104.

The first metal portion 104 includes an amorphous region 107. In electroless plating, nucleation also occurs in the amorphous region 107. An amorphous region 109 of the second metal portion 108 is formed on the amorphous region 107 of the first metal portion 104. The metal atom of the second metal portion 108 forming the amorphous region 109 forms a metal bond with the metal atom of the first metal portion 104 forming the amorphous region 107.

Regions which continue to grow in an amorphous due to lattice distortion or the like in the middle of growth when the second metal portion 108 is heteroepitaxially grown on the first metal portion 104 may also be included. Thus, the second metal portion 108 includes a plurality of heteroepitaxially grown crystal regions 108f1, 108f2, 108f3, 108f4 with different crystal orientations, further includes an amorphous region.

The crystalline grains 106f1, 106f2, 106f3, 106f4 of the first metal portion 104 do not always have the same crystal orientation and are different. Therefore, the crystal orientations of each of the crystal regions 108f1, 108f2, 108f3, 108f4 of the second metal portion 108f are also different. When the width W of the linear pattern of the first metal portion 104 becomes 15 nm or less, preferably 10 nm or less, the electric field concentration occurs at the interface of the first metal portion 104 and the plating solution due to its shape so that the nucleation probability becomes high. Therefore, the second metal portion 108f formed by electroless plating is formed to continuously cover the surface of the first metal portion 104. The crystal regions 108f1, 108f2, 108f3, 108f4 heteroepitaxially grown corresponding to each of the crystalline grains 106f1, 106f2, 106f3, 106f4 form grain boundaries with the adjacent crystal regions having different crystal orientations from each other and integrated by further including the amorphous region 109. The surface of the second metal portion 108f becomes a smooth shape because the radius of curvature is made as larger as possible and an energetically stable structure is to be obtained in the process of growing into a rod shape by electroless plating.

The second metal portions 108f, 108g are grown by electroless plating while forming a heteroepitaxial interface with the first metal portion 104. For example, the second metal portion 108f of the first electrode 112b includes the crystal regions 108f1, 108f2, 108f3, 108f4 heteroepitaxially grown corresponding to the plurality of crystalline grains 106f1, 106f2, 106f3, 106f4 contained in the first metal portion 104. In other words, the first electrode 112b contain a heteroepitaxial structure 200f1 formed by the crystal region 108f1 and the crystalline grain 106f1, a heteroepitaxial structure 200f2 formed by the crystal region 108f2 and the crystalline grain 106f2, a heteroepitaxial structure 200f3 formed by the crystal region 108f3 and the crystalline grain 106f3, and a heteroepitaxial structure 200f4 formed by the crystal region 108f4 and the crystalline grain 106f4.

The second metal portions 108f, 108g grown on the first metal portion 104 form gaps of 5 nm or less on the end portions of the pair of linear patterns by the self-stop function of the electroless plating. Since the first electrode 112b and the second electrode 114b are formed so as to continuously cover the surface of the first metal portion 104 with the second metal portion 108, a gap of 5 nm or less is formed on the center line of the linear pattern. In this case, since the surfaces of the first metal portion 104 are continuously covered with the second metal portions 108f, 108g, nanogaps can be formed on a portion (on the center line of the linear pattern) where the end portions of the linear patterns of the first electrode 112b and the second electrode 114b faces each other.

As in the second embodiment, platinum (Pt) is used as the first metal portion 104, and gold (Au) is preferably used as the second metal portions 108f,108g. A titanium (Ti) layer may be provided as the base metal layer 102 between the first metal portion 104 and the substrate 100. In the above, the first electrode 112b will be described, such a structure is the same for the second electrode 114b.

According to the present embodiment, by continuously covering the surface of the first metal portion 104 with the second metal portions 108f, 108g, the gap interval of the nanogap electrodes 204b can be miniaturized, and the position at which the nanogap is formed can be precisely controlled.

Example 1

6. Producing Example of Platinum (Pt)†Gold (Au) Heteroepitaxial Structure

This example shows a results of comparative experiment to confirm that the reduction reaction (PtO→Pt) on the platinum (Pt) surface is attributable to the combination of an iodine ion ($I^-$, $I_3^-$) derived from iodine tincture and a reducing agent (L(+)-ascorbic acid ($C_6H_8O_6$)). This example shows the results of the evaluation of three types of samples prepared by performing pretreatment before electroless gold plating using the following three types of pretreatment solutions A, B, and C.

6-1. Preparation of Pretreatment Solution

Three types of pretreatment solutions A, B, and C were prepared.

Hereinafter, the contents of the pretreatment solutions A, B, and C and the method for preparing the same are shown.

Pretreatment solution A: iodine tincture+ascorbic acid
Pretreatment solution B: iodine tincture only
Pretreatment solution C: ethanol+ascorbic acid (1) Pretreatment Solution A (a) Put 3 mL of iodine tincture in container A, add 1.2 g of L(+)-ascorbic acid ($C_6H_8O_6$), and shake container A to mix the two. Then, warm it in hot water at 85° C. for about 30 seconds. Thereafter, stir it for about 30 seconds using an ultrasonic cleaner. Further, warm it in hot water at 85° C. for about 30 seconds.

(b) After warming in hot water, stand still container A in silence in a light-shielded state for about 1.5 hours.

(c) Put 0.6 g of L(+)-ascorbic acid ($C_6H_8O_6$) in container B, take out 2 mL of the supernatant from container A, and add it to container B.

(d) Stir the added ascorbic acid and the supernatant liquid by shaking container B, and warm it in hot water at 85° C. for about 30 seconds. Thereafter, drop the ascorbic acid on the wall into the solution using the ultrasonic cleaner, and warm it again in hot water at 85° C. for about 30 seconds.

(e) Stand still container B in a light-shielded state for about 30 minutes.

(2) Pretreatment Solution B (a) Put 3 mL iodine tincture in container C cleaned with acetone and ethanol, and warm it in hot water at 85° C. for about 30 seconds. Thereafter, stir it for about 30 seconds using the ultrasonic cleaner. Again, warm it in hot water at 85° C. for about 30 seconds.

(b) Stand still container C in a light-shielded state for about 1.5 hours.

(c) After standing still, take out 2 mL of the supernatant liquid from container C and inject it into empty container D.

(d) Warm the solution taken out into container D in hot water at 85° C. for about 30 seconds. Thereafter, stir it using the ultrasonic cleaner and warm it again in hot water at 85° C. for about 30 seconds.

(e) Stand still container D in a light-shielded state for about 30 minutes.

(3) Pretreatment Solution C (a) Put 3 mL ethanol in container E, add 1.2 g of L(+)-ascorbic acid ($C_6H_8O_6$), and shake container E to mix the two. Then, warm it in hot water at 85° C. for about 30 seconds. Thereafter, stir it for about 30 seconds using the ultrasonic cleaner. Further, warm it in hot water at 85° C. for about 30 seconds.

(b) After warming in hot water, stand still container A in a light-shielded state for about 1.5 hours.

(c) Put 0.6 g of L(+)-ascorbic acid ($C_6H_8O_6$) in container F, take out 2 mL of the supernatant liquid from container E, and add it to container B.

(d) Stir the added ascorbic acid and the supernatant liquid by shaking container F, and warm it in hot water at 85° C. for about 30 seconds. Thereafter, drop the ascorbic acid on the wall into the solution using the ultrasonic cleaner, and warm it in hot water again at 85° C. for about 30 seconds.

(e) Stand still container F in a light-shielded state for about 30 minutes.

6-2. Preparation of Electroless Gold Plating Solution

A method for preparing an electroless gold plating solution will be described.

(a) Put gold foil in container G, put 3 mL of iodine tincture and shake it. Thereafter, stir the solution for about 3 hours using the ultrasonic cleaner.

(b) Add 1.2 g of L(+)-ascorbic acid ($C_6H_8O_6$) to container G. Thereafter, stir the solution by shaking container G, and warm it in hot water at 85° C. for about 30 seconds. At the time of this warming, confirm that the color of the solution replaces deep blue-violet color with golden color. The color change of the solution indicates that a gold ion ($Au^+$, $Au^{3+}$) has been formed.

(c) Thereafter, stir it using the ultrasonic cleaner until the ascorbic acid on the wall of container G falls into the solution (about 30 seconds). Then, warm it again in hot water at 85° C. for about 30 seconds.

(d) Stand still container G in a light-shielded state for about 1.5 hours.

(e) After standing still, add 0.6 g of L(+)-ascorbic acid ($C_6H_8O_6$) to container H, take out 2 mL of the supernatant liquid from container G and add it to container H. At this time, although gold foil remains in container G, this causes clusters to be formed at the stage of the electroless gold plating treatment, so care should be taken not to mix it with the supernatant liquid to be taken out.

(f) Stir the added ascorbic acid and the supernatant liquid by shaking container H, and warm it in hot water at 85° C. for about 30 seconds. At the time of this warming, confirm that the color of the solution replaces golden color with clear yellowish color. After warming in hot water, stir it again using the ultrasonic cleaner, drop the ascorbic acid on the wall into the solution, and warm it again in hot water at 85° C. for about 30 seconds.

(g) Stand still container H in a light-shielded state for 30 minutes.

6-3. Preparation of Samples

A titanium (Ti) layer having a thickness of 2 nm and a platinum (Pt) layer having a thickness of 9 nm were formed by a sputtering method on a silicon wafer on which a silicon oxide ($SiO_2$) layer was formed.

6-4. Cleaning Treatment Before Electroless Gold Plating

Before the electroless gold plating treatment, cleaning of a sample on which a platinum (Pt) layer is formed is performed. The cleaning treatment is carried out as follows.

(a) Acetone boiling (50° C., 2 min×2 times), ethanol boiling (70° C., 2 min×2 times). Thereafter, the sample is dried with a nitrogen blow.

(b) The sample after drying is subjected to oxygen-plasma treatment for about 5 minutes. This treatment aims at removing an organic material adhering to the sample surface by the action of oxygen radicals.

(c) Repeat the above treatments (a) and (b).

(d) After performing the cleaning of the above (a), UV-ozone treatment is performed.

It is considered that platinum oxides (PtO, $PtO_2$) are partially formed on platinum (Pt) surfaces by the oxygen-plasma treatment and the UV-ozone treatment.

6-5. Electroless Gold Plating Treatment

The procedure for electroless gold plating treatment is shown below.

(a) Add 8 mL of ultrapure water to a cleaned container I and add 8 µL of the pretreatment solution (A, B, or C), and stir the mixture for about 5 seconds. Thereafter, the sample is immersed for 10 seconds.

(b) Take out the sample from container I, rinse it with ultrapure water for 5 seconds and perform acetone boiling (2 minutes) and ethanol boiling (2 minutes). Thereafter, the sample is dried with a nitrogen blow.

(c) Put 8 mL of ultrapure water in container J, add 8 µL of the electroless gold plating solution, and after stirring it for about 5 seconds, the sample is immersed for 10 seconds.

(d) Take out the sample from container J, rinse it with ultrapure water for 5 seconds, and perform acetone boiling (2 minutes) and ethanol boiling (2 minutes). Thereafter, the sample is dried with a nitrogen blow.

(e) Thereafter, the above processes (c) and (d) are set as one set and are repeated until the cumulative time of immersion in the electroless gold plating solution reaches the target value.

Electroless gold plating treatment is performed as described above. When the pretreatment is omitted, the above-mentioned treatment (a) and (b) are removed.

6-6. Experimental Results

Four kinds of samples were prepared according to the preparation conditions (1) to (IV) shown below. As for the preparation conditions (1) to (IV), the conditions of the electroless plating treatment are common, and the presence or absence of the pretreatment and the type of the pretreatment solution are appropriately set.

Electroless gold plating treatment 10 seconds×3 times (without pretreatment)  (I)

Immersion in pretreatment solution $A$ 10 seconds+ electroless gold plating treatment 10 seconds×3 times  (II)

Immersion in pretreatment solution $B$ 10 seconds+ electroless gold plating treatment 10 seconds×3 times  (III)

Immersion in pretreatment solution $C$ 10 seconds+ electroless gold plating treatment 10 seconds×3 times  (IV)

Figure 4A:
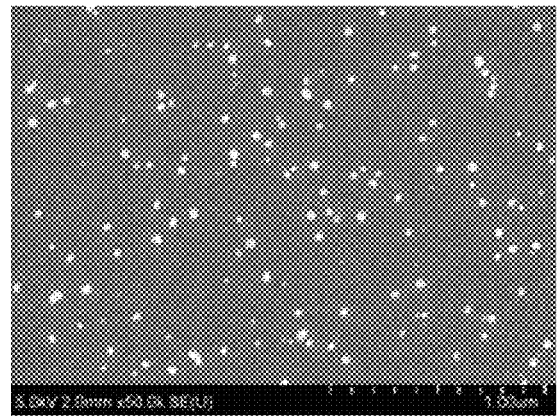
FIG. 4A shows a SEM image of a sample prepared in an example of the present invention and shows a sample without pretreatment.
Figure 4B:
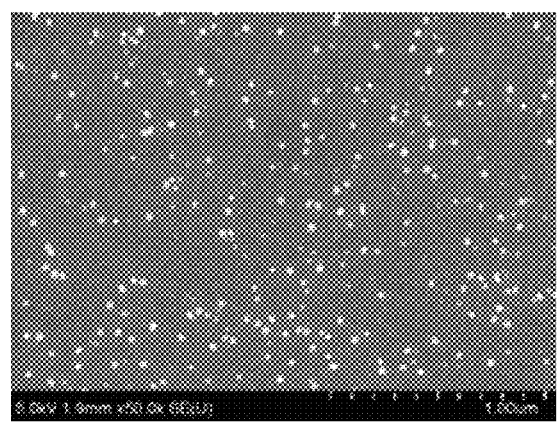
FIG. 4B shows a SEM image of a sample prepared in an example of the present invention and shows a sample treated with pretreatment solution A.
Figure 4C:
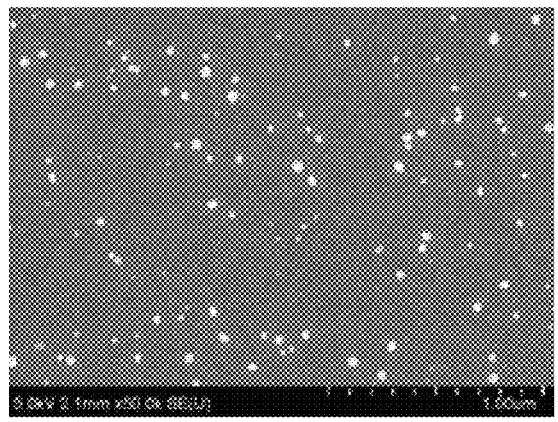
FIG. 4C shows a SEM image of a sample prepared in an example of the present invention and shows a sample treated with pretreatment solution B.
Figure 4D:
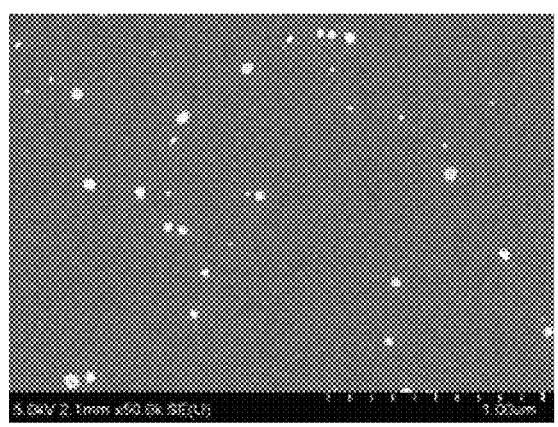
FIG. 4D shows a SEM image of a sample prepared in an example of the present invention and shows a sample treated with pretreatment solution C.

The surface state of the sample prepared under each condition was observed with a scanning electron microscope (SEM). FIG. 4A, FIG. 4B, FIG. 4C, and FIG. 4D show SEM images obtained by observing the surface states of the respective samples. Here, FIG. 4A is a sample prepared under the preparation condition (1), FIG. 4B is a sample prepared under the preparation condition (II), FIG. 4C is a sample prepared under the preparation condition (Ill), and FIG. 4D is a sample prepared under the preparation condition (IV).

In the respective SEM images shown in FIG. 4A, FIG. 4B, FIG. 4C, and FIG. 4D, a state in which a plurality of gold (Au) lumps are discretely formed on platinum (Pt) surfaces is observed. However, it is observed that the state varies depending on the presence or absence of pretreatment and the type of the pretreatment solution.

When comparing the sample without pretreatment in FIG. 4A with the sample treated with the pretreatment solution A in FIG. 4B, it is observed that the nucleation density of gold (Au) is higher when pretreatment is performed using the pretreatment solution A than when pretreatment is not performed. It is observed that the formed gold (Au) lumps tend to be smaller when the treatment is performed in the pretreatment A.

When comparing the sample without pretreatment in FIG. 4A with the sample treated with the pretreatment solution B in FIG. 4C, it is observed that the nucleation density of gold (Au) is comparable between the sample without pretreatment and the sample pretreated with the pretreatment solution B. It is observed that the size of the formed gold (Au) lump is also comparable.

When comparing the sample without pretreatment in FIG. 4A with the sample treated with the pretreatment solution C in FIG. 4D, it is observed that the sample pretreated with the pretreatment solution C has a lower nucleation density of gold (Au) compared with the sample without pretreatment. It is observed that the sample prepared by the pretreatment solution C has a lower nucleation density than the sample prepared by any other condition, and the size of the formed gold (Au) lump is larger.

The density of the gold (Au) lump per unit area of the sample prepared without the pretreatment in FIG. 4A is $40/\mu m^2$, the density of the gold (Au) lump per unit area of the sample prepared with the pretreatment solution A in FIG. 4B is $80/\mu m^2$, the density of the gold (Au) lump per unit area of the sample prepared with the pretreatment solution B in FIG. 4C is $20/\mu m^2$, and the density of the gold (Au) lump per unit area of the sample prepared with the pretreatment solution C in FIG. 4D is $20/\mu m^2$. When the area ratio of the heteroepitaxial junction to the total area is estimated on the assumption that the gold lump is heteroepitaxially grown, the area ratio of the sample prepared without the pretreatment in FIG. 4A is 0.1 (10%), the area ratio of the sample prepared with the pretreatment solution A in FIG. 4B is 0.2 (20%), the area ratio of the sample prepared with the pretreatment solution B in FIG. 4C is 0.05 (5%), and the area ratio of the sample prepared with the pretreatment solution C in FIG. 4D is 0.01 (1%). From these values, it can be seen that the sample treated with the pretreatment solution A in FIG. 4B has a larger percentage of heteroepitaxially grown gold (Au) on platinum (Pt) compared with the sample prepared under other conditions. From these results, the contact resistance when a metal layer is formed as the third metal portion on the sample treated with the pretreatment solution A can be made less than or equal to half as compared with the case of the sample treated with other conditions.

From these results, it is understood that when the pretreatment is performed with the pretreatment solution A, the nucleus growth of gold (Au) is promoted on the platinum (Pt) surface, and the plating easily progresses. This is considered to be a state in which platinum oxide (PtO or the like) is easily reduced on the surface of platinum (Pt). In the pretreatment solution A, there is a combination of iodine ion ($I^-$, $I_3^-$) derived from iodine tincture and a reducing agent (L(+)-ascorbic acid ($C_6H_8O_6$)). It is thought that the platinum oxide (PtO) on the platinum (Pt) surface is reduced to platinum (Pt), the gold ion ($Au^+$, $Au^{3+}$) is reduced by surface limited redox replacement (SLRR), grows on the platinum (Pt) surface, and platinum (Pt) in other region is oxidized to form platinum oxide (PtO). Platinum oxide (PtO) is present on the platinum (Pt) surfaces before electroless gold plating, and it is considered that the combination of iodine ion ($I_3^-$) and a reducing agent promote the reduction reaction (PtO→Pt) of platinum oxide.

Since iodine ion ($I_3^-$) is an oxidant and L(+)-ascorbic acid ($C_6H_8O_6$) is a reductant, so that the material that proceeds conflicting reaction of oxidation and redaction is present in the electroless plating solution in this embodiment. Divalent platinum ion ($Pt^{2+}$) forms a plane tetracoordinate type, tetravalent platinum ion ($Pt^{4+}$) forms a six-coordinated octahedron structure, and iodine ion ($I^-$) becomes a ligand. It is considered that an oxygen ion ($O^{2-}$) and an iodine ion ($I^-$) are substituted when strongly oxidizing iodine ion ($I_3^-$) approaches the vicinity of platinum oxide (PtO) formed on the platinum (Pt) film. It is considered that platinum ion ($Pt^{2+}$) coordinated with iodine ion ($I^-$) on platinum (Pt) surface is reduced to platinum (Pt) by the reducing agent (L(+)-ascorbic acid ($C_6H_8O_6$)), and gold ion ($Au^+$, $Au^{3+}$) is reduced by surface limited redox replacement (SLRR) to form a platinum (Pt) surface.

Figure 5:
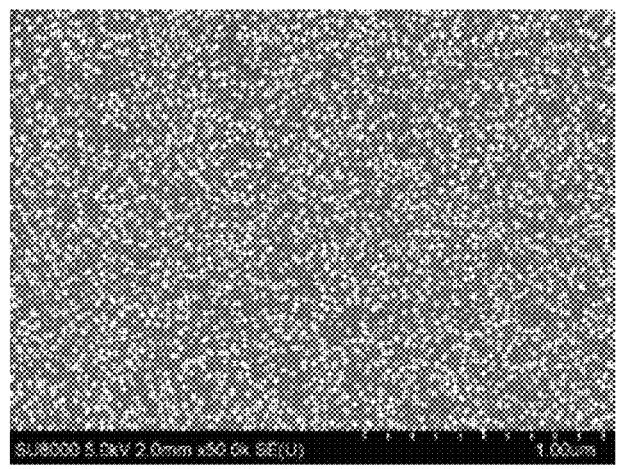
FIG. 5 shows a SEM image of a sample prepared in Example 1, and shows a sample prepared by repeating the electroless gold plating treatment 10 times.

Here, FIG. 5 shows a SEM image of the surface of the sample when the electroless gold plating treatment is repeated 10 times. From the result shown in FIG. 5, it can be seen that the diameter of the gold (Au) lump is not simply increased, but the nucleation density is increased. The electroless gold plating solution of the present embodiment contains gold ion ($Au^+$, $Au^{3+}$) together with iodine ion ($I^-$, $I_3^-$) as an oxidant and the reducing agent. The result shown in FIG. 5, while forming a platinum (Pt) surface by reducing the platinum oxide (PtO) of the platinum (Pt) surface, it is shown that the gold plating proceeds simultaneously.

When FIG. 5 is observed in detail, it is confirmed that there is a variation in the size of the gold (Au) lump. This is presumed to be due to the electroless gold plating treatment was carried out intermittently. That is, each time the sample is immersed in the electroless gold plating solution, it is presumed that gold lumps of different sizes are generated by the mixture of the reaction of newly nucleating and the reaction of further growth of the already formed gold lumps.

The number of the gold lumps per unit area in FIG. 5 is 1000/$\mu m^2$. Assuming that the gold lump is heteroepitaxial grown, the area ratio of the heteroepitaxial junction to the total area is estimated to be 0.5 (50%). From this value, the contact resistance Rc expected when a metal layer is formed thereon as the third metal portion is sufficiently smaller than the contact resistance Rc of the metal layer.

According to this example, it is shown that, when pretreatment is performed using the pretreatment solution A (iodine tincture+reducing agent), electroless gold plating tends to proceed on the platinum (Pt) surface. In this example, an example in which iodine tincture (a liquid in which iodine and potassium iodide are dissolved in ethanol) is used is shown as an example, but the present invention is not limited thereto, and any solution having the same components as iodine tincture may be substituted. For example, a solution obtained by adding 6 g of iodine (I) and potassium iodide (KI) in 100 mL using ethanol as a solvent may be used.

In this embodiment, the sample prepared under the preparation conditions (I), (II), as described in FIG. 1, gold (Au) is heteroepitaxially grown on the surface of the crystalline grain of platinum (Pt). By further forming a thick layer of metal on such heteroepitaxial structure, it is possible to form a metal stack having high adhesion and low contact resistance.

Example 2

This example shows an example of the metal stack 202 having heteroepitaxial structure in which a metal layer is stacked as the third metal portion 110 on the heteroepitaxial structure 200 as shown in FIG. 1.

An electroless gold plating treatment was performed using a commercially available electroless gold plating solution on a sample prepared under the same preparation condition (i.e., no treatment with the pretreatment solution A and a plating time of 10 seconds×10 times) as those of the preparation condition (1) of Example 1 to produce the third metal portion 110. As the commercially available electroless gold plating solution, an electroless gold plating solution (Aurexel MD101 Au 4 g/L) manufactured by Kanto Chemical Co., Inc. was used. This electroless gold plating treatment was performed on a hot water bath at 57° C., and a thick film of gold (Au) was grown at a growth rate of 1.2 μm/30 minutes. After performing electroless gold plating for a predetermined time, rinsed with ultrapure water (5 seconds), then acetone boiling (2 minutes) and ethanol boiling (2 minutes) were performed, and treatment was performed with a nitrogen blow.

Figure 6:
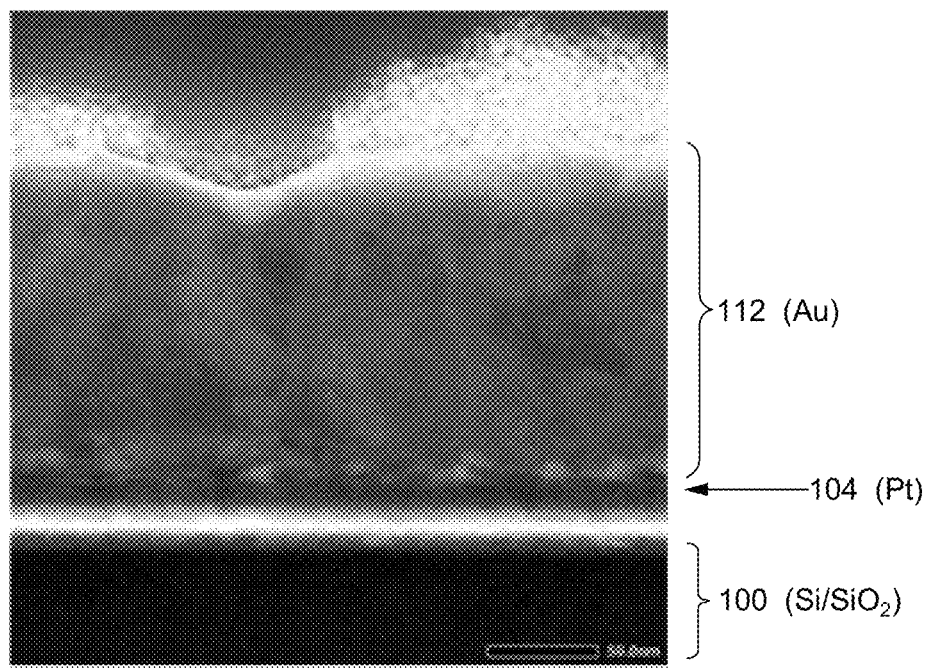
FIG. 6 shows a cross-sectional SEM image of a sample prepared in Example 2.

FIG. 6 shows a result of observing a cross-section of the prepared sample with a transmission electron microscope (TEM). FIG. 6 shows a dark field image of the TEM, and a state in which a gold (Au) plating film corresponding to the third metal portion 110 is formed on the platinum (Pt) surface corresponding to the first metal portion 104 is observed. The observation result of FIG. 6 shows that gold (Au) grown on the platinum (Pt) surface by the preparation condition (II) becomes a seed layer, and a thick film of gold (Au) can be formed on the platinum (Pt) surface using a commercially available electroless gold plating solution.

Figure 7A:
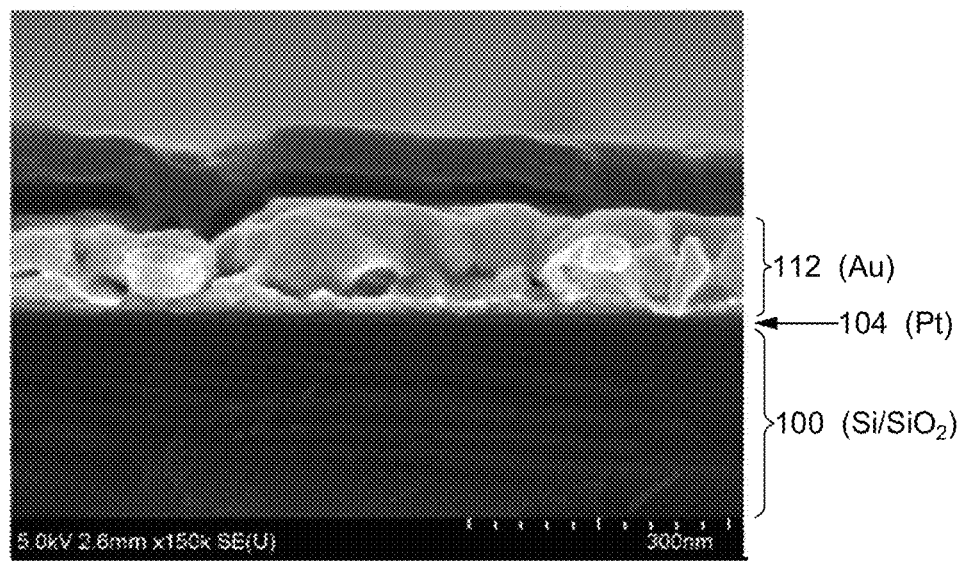
FIG. 7A shows a result of observing a sample evaluated in Example 2 by an electron microscope and shows a cross-sectional SEM image of the sample prepared in Example 2.

FIG. 7A shows a result of observing the cross-sectional condition with SEM by dividing the sample prepared in this example. From FIG. 7A, a platinum (Pt) film corresponding to the first metal portion 104 is formed on the substrate 100, and a plating film of gold (Au) corresponding to the third metal portion 110 is formed thereon (a carbon film for SEM-observation is formed on the gold (Au) layer in the sample). In this sample, although the sample is divided by applying a physical force in order to observe the cross-section, a state in which the gold (Au) layer as the third metal portion 110 is peeled off is hardly observed, and it is understood that the adhesion with the first metal portion 104 (platinum (Pt) film) of the base is good.

Figure 7B:
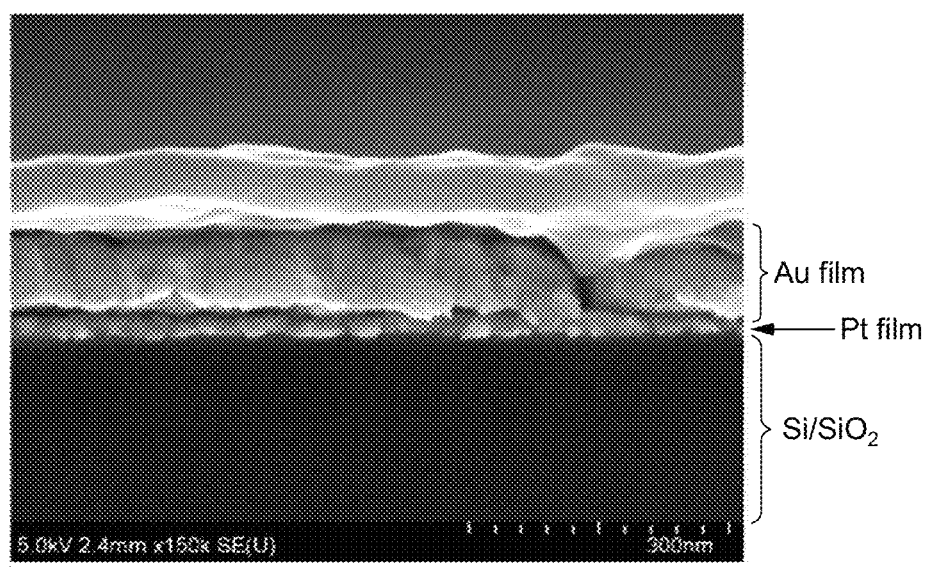
FIG. 7B shows a cross-sectional SEM image of a comparative example with respect to the sample evaluated in Example 2.

On the other hand, FIG. 7B is a comparative example and showing a cross-sectional SEM image of a sample where a thick plating layer of gold (Au) was grown directly on platinum (Pt) using a commercially available electroless gold plating solution (i.e., an electroless gold plating solution containing no oxidant and a reducing agent by iodine ion). In the sample of this comparative example, it is observed that voids are contained at the interface between the platinum (Pt) layer and the gold (Au) layer. From the result of FIG. 7B, it can be seen that the sample of the comparative example has poor adhesion between the thick layer of gold (Au) and the platinum (Pt) layer of the base as compared with the sample of the present example.

According to the present example, by using gold (Au) which was heteroepitaxially grown on a platinum (Pt) surface by the electroless gold plating solution containing Iodine ion as an oxidant and a reducing agent as a seed layer, a high adhesive and thick gold (Au) layer can be formed by electroless gold plating.

Example 3

This example shows a production example of the nanogap electrode 204a having the structures described in FIG. 8A and FIG. 8B.

7-1. Production of the First Metal Portion

As a substrate for producing the first metal portion, a silicon wafer with a silicon oxide film formed on its surface was used. The substrate was cleaned by ultrasonic cleaning using acetone, ethanol, and ultraviolet (UV) ozone treatment, or the like to form a clean surface.

An electron-beam resist solution (a resist solution obtained by mixing ZEP-520A (Zeon Corporation) and ZEP-A (Zeon Corporation)) was applied to the surface (the surface of the silicon oxide film) of the substrate by a spinner to form a resist film, and then a prebake was performed. The substrate on which the resist film was formed was set in an electron beam lithography system (ELS-7500EX manufactured by ELIONIX INC.), and electron beam lithography was performed on the resist film to form a resist film on which a pattern for forming an electrode was formed. After that, development processing was performed to form a resist pattern that opens the lithographed portion (a portion corresponding to the electrode pattern).

Next, on the resist film on which the pattern was formed, a titanium (Ti) layer is formed as the base metal layer using an electron beam deposition system (E-400EBS manufactured by Shimadzu Corporation), further a platinum (Pt) layer was formed as the first metal portion 104. The titanium (Ti) layer was formed to improve the adhesion of the platinum (Pt) layer. The thickness of the titanium (Ti) layer was 3 nm, and the thickness of the platinum (Pt) layer was 10 nm.

The patterned resist film was removed by immersing the substrate on which the titanium (Ti) layer and the platinum (Pt) layer were stacked in a peeling solution (ZDMAC (Zeon Corporation)) and allowing the substrate to stand and bubbling. The metal layer in which the titanium (Ti) layer and the platinum (Pt) layer were stacked was lifted off together with peeling of the resist film. As a result, a metal layer remained in the portion of the opening pattern of the resist film, and other portions were peeled off and removed together with the resist film. In this way, on substrate, a platinum electrode as the first metal portion 104 (more precisely, titanium/platinum is stacked electrode) was formed. The platinum electrode formed a linear pattern and had a line width of 10 nm.

Then, a contact pad for electrical characteristic measurement was formed. After cleaning the substrate on which the platinum electrode was formed, a positive resist was applied and prebaked to form a resist film. The resist film was exposed by a mask aligner (MA-20 manufactured by Mikasa Co., Ltd.) and developed to form a resist film having an opening pattern corresponding to the pad for a probe contact.

Using the electron beam deposition system (E-400EBS manufactured by Shimadzu Corporation), a metal layer in which a titanium (Ti) layer and platinum (Pt) layer were stacked. Thereafter, the resist film was peeled off and the metal layer was lifted off to form a pad for the probe contact.
7-2. Formation of the Second Metal Portion (Electroless Gold Plating Treatment)

Figure 10:
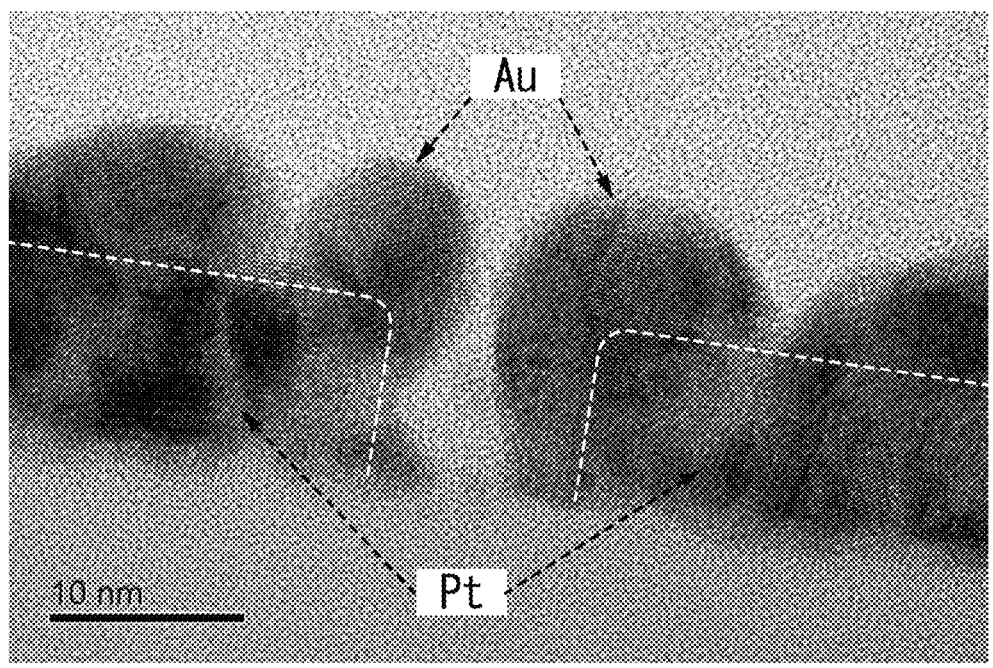
FIG. 10 shows a TEM bright field image of nanogap electrodes prepared in Example 3.

An electroless gold plating solution was prepared in the same manner as in Example 1, and an electroless gold plating treatment was performed on a platinum electrode having a linear pattern.
7-3. Observation of Nanogap Electrode FIG. 10 shows a TEM bright field image of the cross-sectional structure of the nanogap electrode formed in the present example. As can be seen from FIG. 10, the striped structure is observed in the platinum (Pt) region corresponding to the first metal portion. The direction of the stripe varies from place to place, and it is confirmed that platinum (Pt) has a polycrystalline structure. It is observed that the striped structure observed in the platinum (Pt) region extends to the gold (Au) region corresponding to the second metal portion. From this, it is understood that gold (Au) is heteroepitaxially grown on the platinum (Pt) film also in the nanogap electrode.

Furthermore, gold (Au) grown in hemispherical shape on a platinum (Pt) film includes a plurality of crystal regions having different crystal orientations and is observed having a shape of hemispherical shape. This is considered, because the nucleation probability is high, that gold (Au) is heteroepitaxially grown corresponding to each of the grains of platinum (Pt) and integrated while forming grain boundaries with adjacent crystal regions having different crystal orientations in the crystal growth process. Furthermore, since gold (Au) is to increase the radius of curvature as much as possible, so that the surface tension is reduced, and the heteroepitaxial growth while taking an energetically stable structure, it is considered to form a hemispherical smooth surface.

The two hemispherical shape gold (Au) grown on the end portions of the two-opposing platinum (Pt) layers are clearly separated, confirming that the nanoscale gap is formed. Thus, according to the present example, it was confirmed that the nanogap electrode can be formed by setting the electrode pattern formed of platinum (Pt) to a line width of 10 nm and epitaxially growing island-shaped gold (Au) by electroless gold plating.

Example 4

Figure 11A:
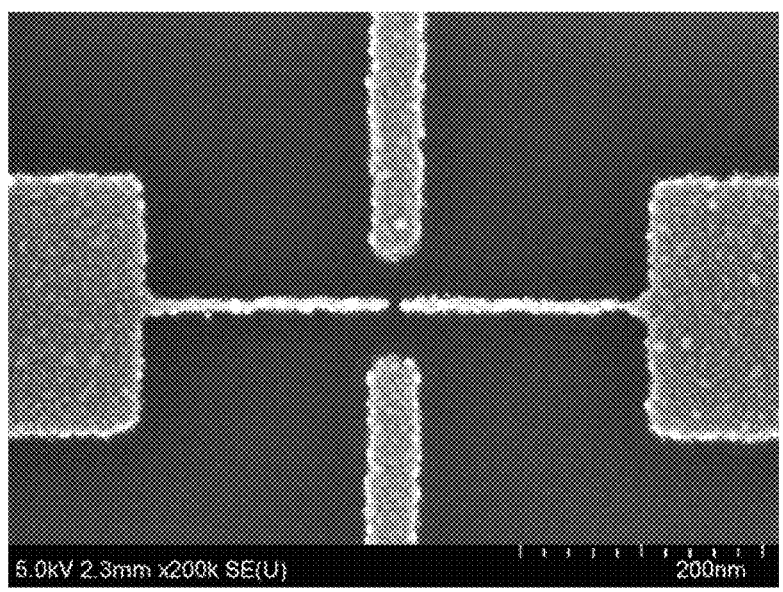
FIG. 11A shows a SEM image of nanogap electrodes prepared in Example 3 and shows a case where the processing time is 6 seconds.
Figure 11B:
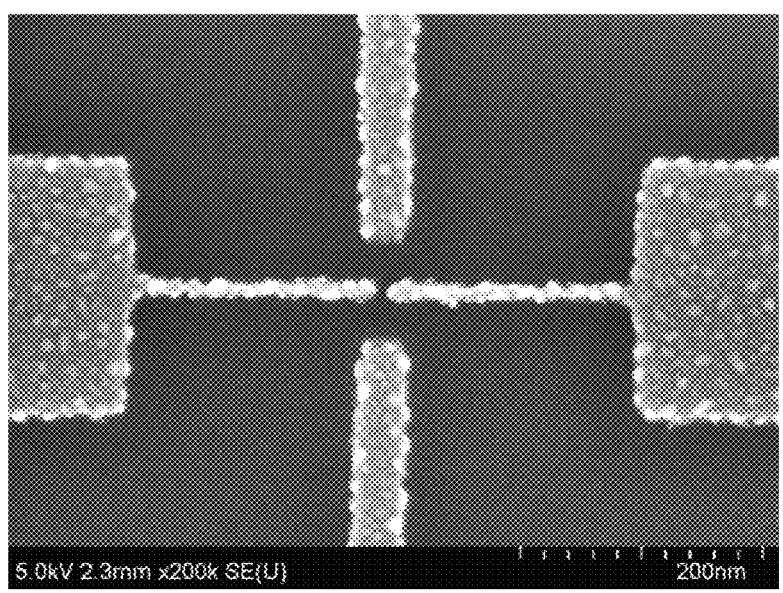
FIG. 11B shows a SEM image of nanogap electrodes prepared in Example 3 and shows a case where the processing time is 10 seconds.

This example shows a production example of the nanogap electrode 204b having the structures described in FIG. 9A and FIG. 9B.
8-1. Production of the First Metal Portion and the Second Metal Portion The first metal portion was formed in the same manner as in Example 1. As for the second metal portion, gold (Au) was epitaxially grown on the platinum (Pt) film using the same electroless gold plating solution as in Example 3. At this time, oxygen plasma treatment was sufficiently performed on the surface of the platinum (Pt) layer.
8-2. Observation of Nanogap Electrode FIG. 11A and FIG. 11B show SEM images of the formed nanogap electrode. FIG. 11A shows the result of electroless gold plating treatment time of 6 seconds, and FIG. 11B shows the result of electroless gold plating treatment time of 10 seconds. It is observed from FIG. 11A that a coating of gold (Au) which is the second metal portion is uniformly formed in a portion where the line width of the platinum (Pt) electrode formed as the first metal portion is 10 nm. In the portion of the width of 200 nm, it was observed that gold (Au) cannot grow to uniform and remains isolated in island-shape because of the low nucleation probability compared to the portion of the line width of 20 nm.

On the other hand, in FIG. 11B, it is observed that the uniformity of the gold (Au) layer is worse in the portion of the line width of 10 nm than in FIG. 11A. It is also observed that particle diameter of gold (Au) is increased in the region of line width of 200 nm.

As described above, according to the present example, it has been shown that the nanogap electrode in which the gold (Au) layer is uniformly grown on the platinum (Pt) surface is formed by optimizing the electroless gold plating treatment time with the electrode pattern formed of platinum (Pt) having a line width of 10 nm.

Example 5

The present example shows an example of controlling the shape of the nanogap electrode by heat treatment. The process is the same as that of the fourth embodiment except that a heat treatment step is added.

Figure 12A:
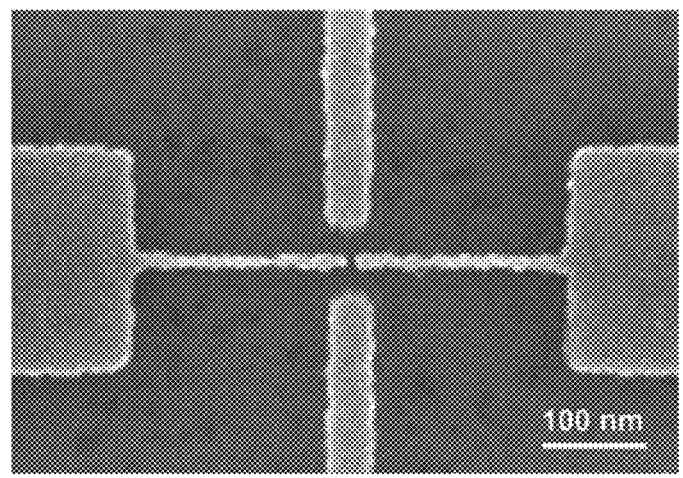
FIG. 12A shows a SEM image of nanogap electrodes prepared in Example 5 and shows the surface condition of a platinum electrode pattern before heat treatment.
Figure 12B:
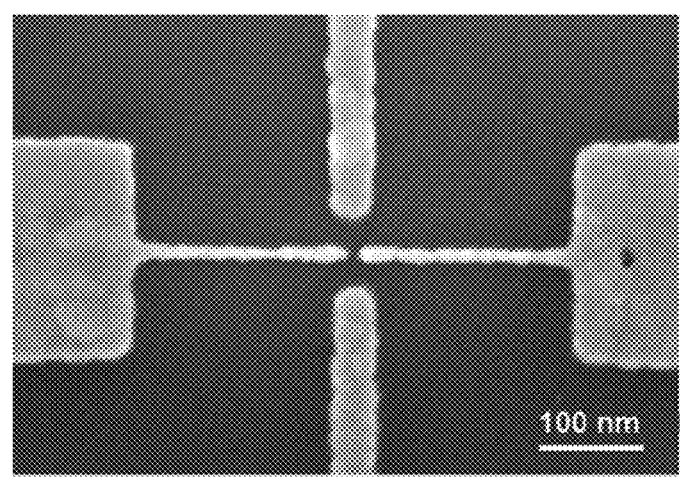
FIG. 12B shows a SEM image of nanogap electrodes prepared in Example 5 and shows the surface condition of a platinum electrode pattern after heat treatment.

In the process shown in the third example, a platinum electrode having a linear pattern was formed, and then heat treatment was performed. Heat treatment was carried out in inert gas at 500° C., for 0.5 hours. FIG. 12A shows a SEM image obtained by observing the surface state of the platinum electrode before the heat treatment, and FIG. 12B shows a SEM image obtained by observing the surface state of the platinum electrode after the heat treatment. As the results of SEM observation, it is observed that the end portion of the platinum electrode having a linear pattern is rounded to have curvature by heat treatment. This result is considered to be the result of the manifestation of the shape change by Rayleigh instability (the change which tries to become a spherical shape with a large stable radius of curvature of energy) by forming the platinum electrode into a linear pattern refined to the width of 5 nm.

Figure 12C:
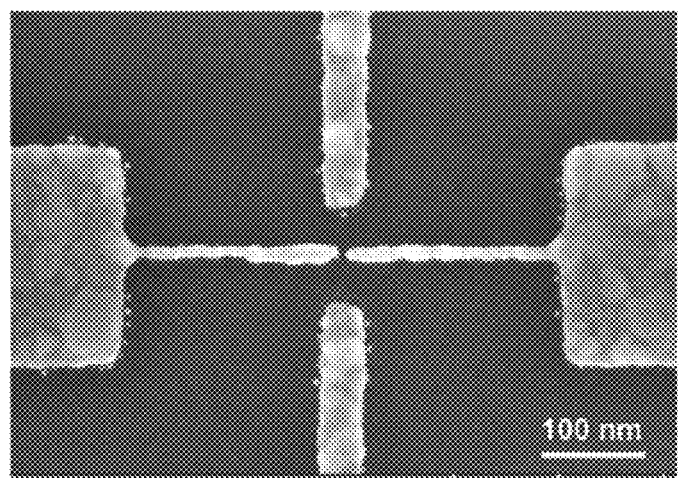
FIG. 12C shows a SEM image of nanogap electrodes prepared in Example 5 and shows a result of electroless gold plating on a surface of a platinum electrode pattern after heat treatment.

FIG. 12C shows a SEM image of the nanogap electrode after electroless gold plating treatment. On the surface of the platinum electrode, a state in which a gold plating film as the second metal portion is continuously formed particularly in a portion having a linear pattern is observed. Since the end portion of the linear pattern formed by the platinum electrode is molded into a curved surface shape, it is observed that the closest portions of the pair of electrodes are aligned on the central axis of the linear pattern. This indicates that the effect of shape control of platinum electrode by heat treatment is inherited even after electroless gold plating.

According to the present example, by performing the heat treatment to the linear pattern of the platinum electrode forming the first metal portion, it is possible to control the shape of the nanogap electrode, and it was shown that it is possible to control the position of the closest portion. This makes it possible to precisely control the gap interval when producing a nanodevice with the nanogap electrode, and it is expected that process repeatability can be enhanced and that characteristic variations of the fabricated nanodevice can be reduced. For example, when a single-molecule transistor is fabricated as a nanodevice, it is possible to prevent the gate electrostatic capacitance from being biased toward one gate electrode relative to a pair of gate electrodes formed so as to intersect the nanogap electrode, thereby suppressing variations in device characteristics.

Example 6

The present example shows an example of producing the nanogap electrode 204a when palladium (Pd) is used as the first metal portion 104.

9-1. Production of Nanogap Electrode

The nanogap electrode 204a was fabricated in the same manner as in the third embodiment except that palladium (Pd) was used as the first metal portion 104.

9-2. Observation of Nanogap Electrode

Figure 13:
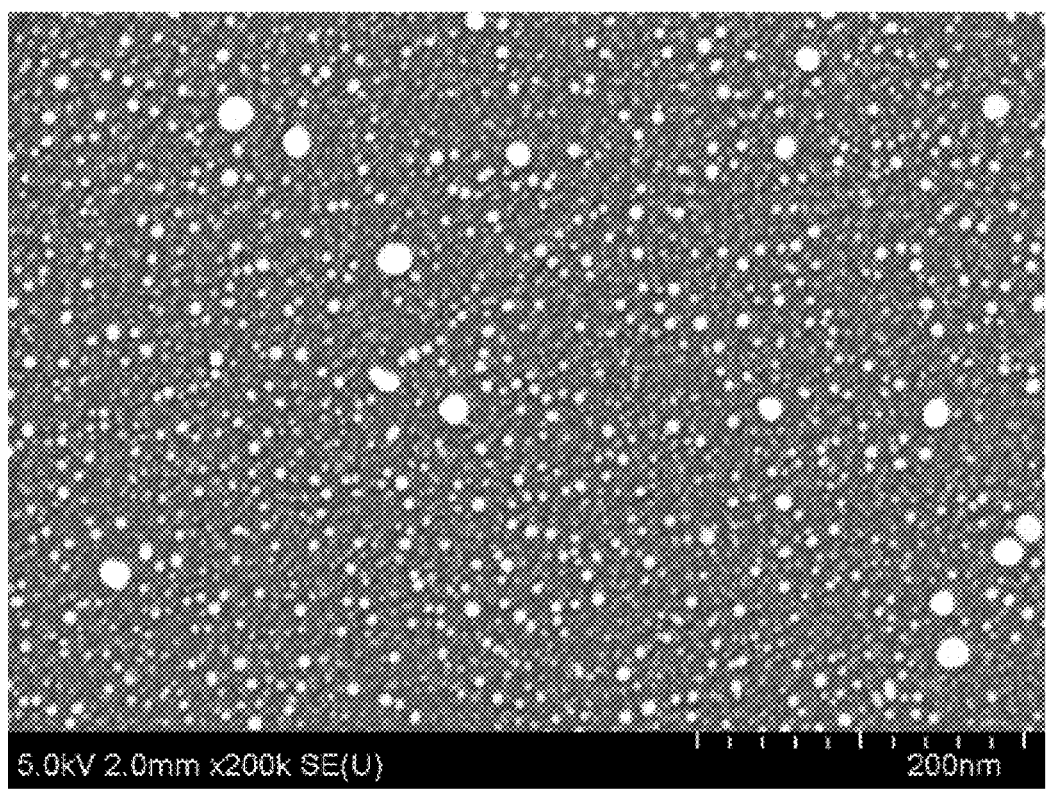
FIG. 13 shows a SEM image of a sample prepared in Example 6.

FIG. 13 shows an SEM image of a sample prepared in the present example. The sample is prepared by electroless gold plating for a total of 20 seconds by repeating the electroless gold plating treatment for 10 seconds and the pure water rinsing treatment for 10 seconds twice on a palladium (Pd) electrode prepared as a first metal portion. In FIG. 13, gold (Au) is a granular material that appears white. It is observed that the particle diameter of gold (Au) is dispersed from 1 nm to about 20 nm. This difference in particle diameter is thought to be caused by the different times of nucleation, and it is thought that the larger particle diameter, the more the nucleation occurred in the early stage of electroless gold plating. Therefore, it is considered that nucleation continues in time series in the electroless gold plating. Such a phenomenon is obviously different from the normal plating mechanism in which a plating film grows based on the nucleus once nucleation has occurred and can be said to be a unique phenomenon observed in an embodiment of the present invention.

Figure 14:
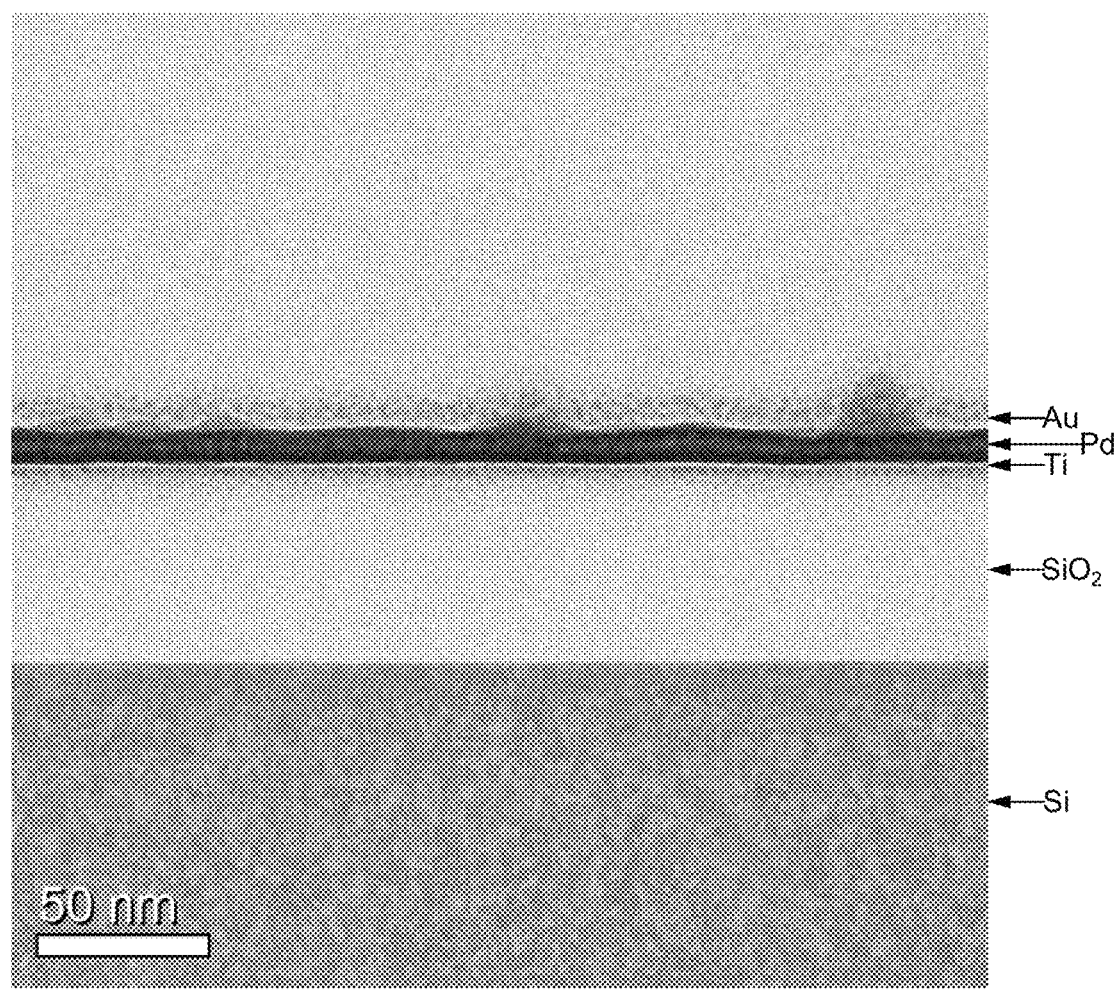
FIG. 14 shows a TEM bright field image obtained by observing a cross-section of a sample prepared in Example 6 with a scanning transmission electron microscope (STEM)

FIG. 14 shows the result of observing the cross-section of the sample prepared in the present example by scanning transmission electron microscope (STEM), showing the TEM bright field image. From FIG. 14, it is observed that a silicon oxide ($SiO_2$) layer, a titanium (Ti) layer, and a palladium (Pd) layer are laminated on a silicon (Si) substrate from below, and gold (Au) is grown discretely on them. A hemispherical mountain-shaped portion indicated by an arrow in FIG. 14 corresponds to a gold (Au) grain and is observed to grow into a hemispherical mountain shaped state so as to draw a smooth tail from the surface of palladium (Pd) which is the base surface. The contact angle of gold (Au) with respect to palladium (Pd) is about 30 degrees, it can be seen that very high wettability.

Figure 15:
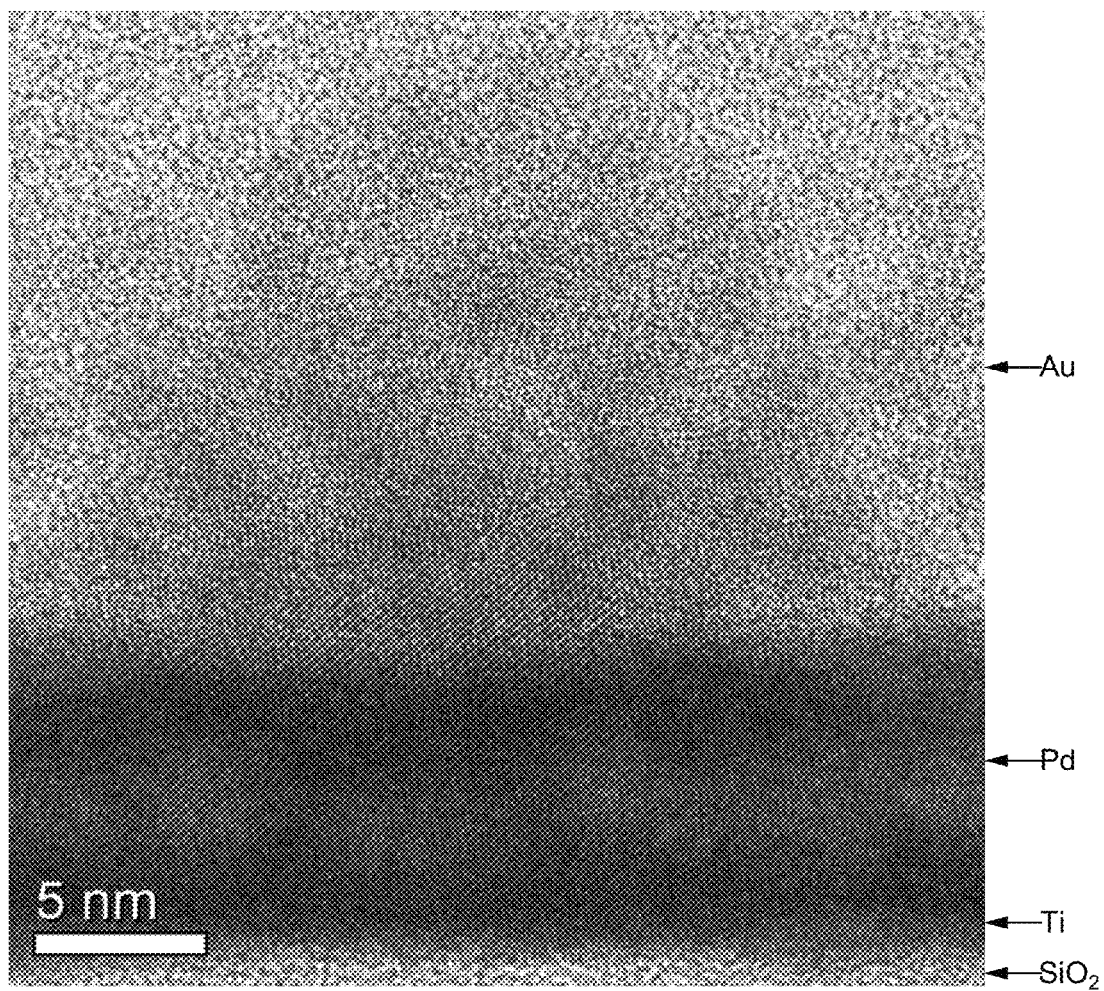
FIG. 15 shows a TEM bright field image obtained by observing a cross-section of a sample prepared in Example 6 with a scanning transmission electron microscope (STEM)
Figure 16:
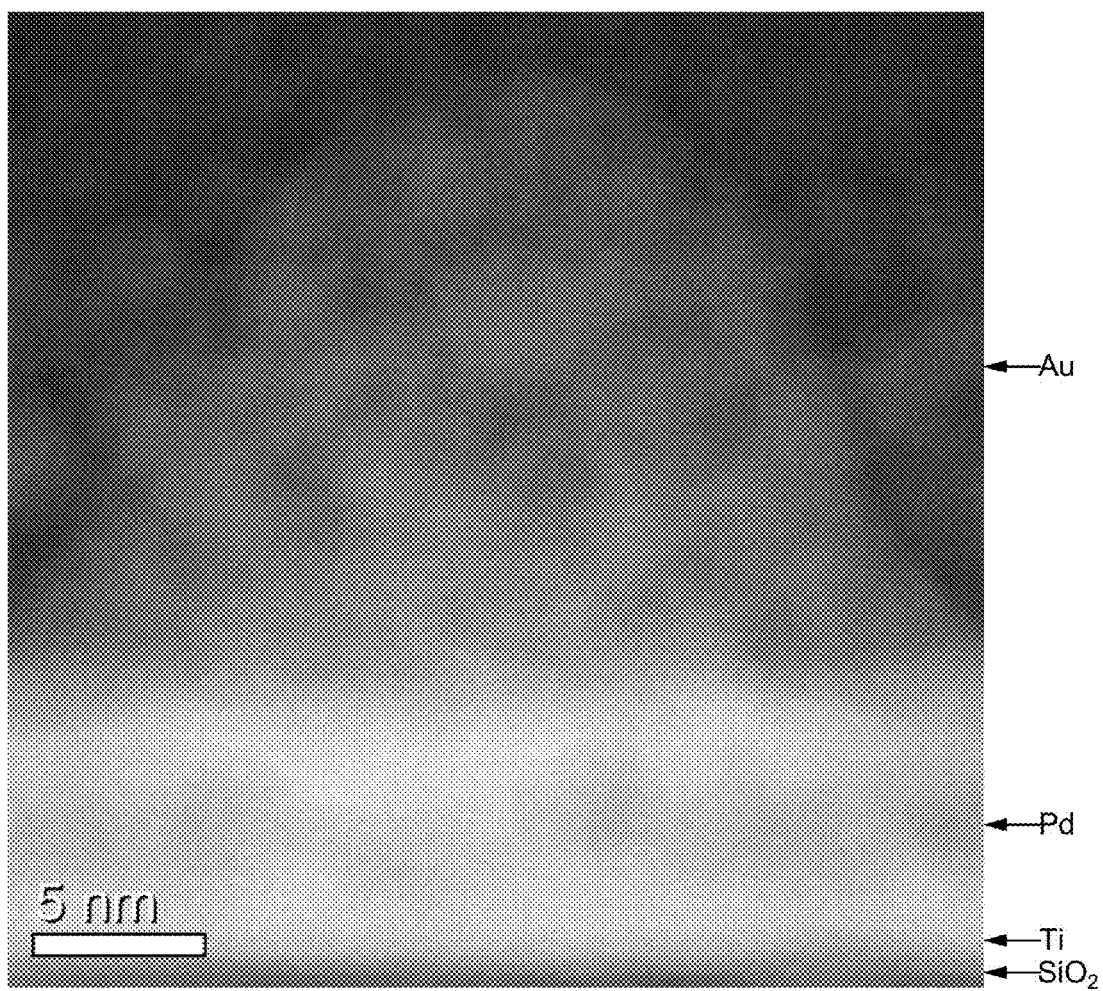
FIG. 16 shows a TEM dark field image obtained by observing a cross-section of a sample prepared in Example 6 with a scanning transmission electron microscope (STEM)

FIG. 15 shows a TEM bright field image when a hemispherical mountain-shaped gold portion (Au) is magnified and observed by STEM. FIG. 16 shows a TEM dark field image of the same sample. As is apparent from the observations of FIG. 15 and FIG. 16, a striped structure is observed in the region of palladium (Pd) corresponding to the first metal portion, and the striped structure extends to the region of gold (Au) while maintaining continuity. From this, it was confirmed that gold (Au) was heteroepitaxially grown on palladium (Pd) by electroless gold plating in the same manner as in the case where the first metal portion was platinum (Pt). Furthermore, gold (Au) grown on the palladium (Pd) film is observed to contain a plurality of crystal regions having different crystal orientations.

Figure 17A:
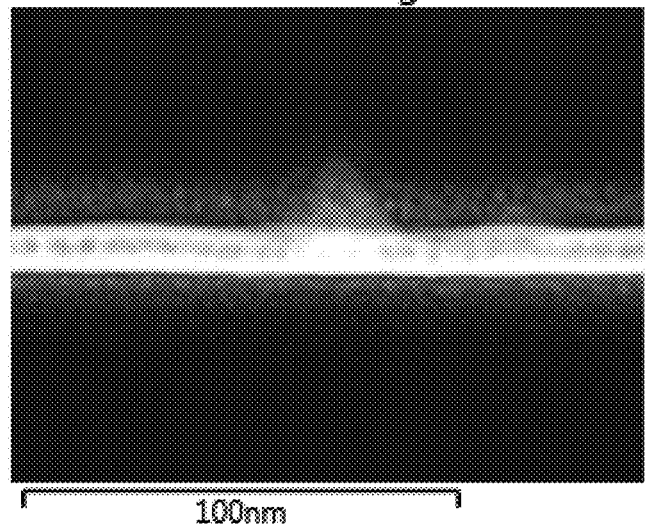
FIG. 17A shows a cross-sectional SEM image of a sample prepared in Example 6.
Figure 17B:
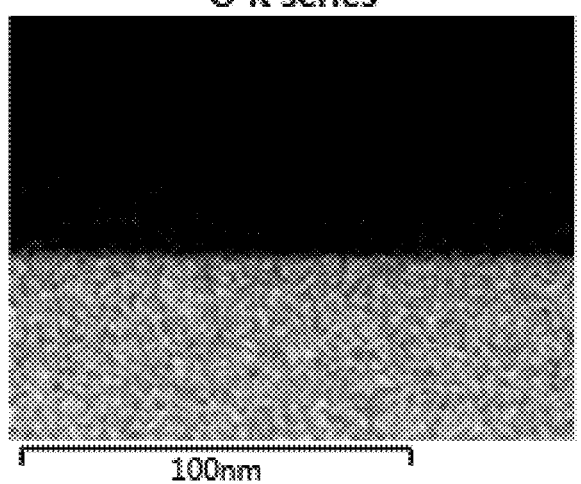
FIG. 17B shows a result of mapping the element distribution of oxygen (O) of the cross-section of a sample prepared in Example 6 by EDX.

FIG. 17A shows a cross-sectional SEM image of the sample, and FIG. 17B to FIG. 17F show the results of elemental mapping of the cross-section of the sample by EDX (Energy Dispersive X-ray Micro Analyzer). Here, FIG. 17B shows the results of elemental mapping for oxygen (O), FIG. 17C for silicon (Si), FIG. 17D for titanium (Ti), FIG. 17E for palladium (Pd), and FIG. 17F for gold (Au), respectively.

Figure 17C:
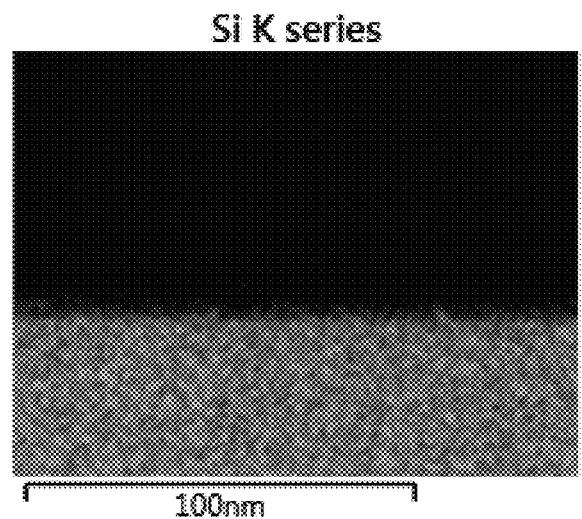
FIG. 17C shows a result of mapping the element distribution of silicon (Si) of the cross-section of a sample prepared in Example 6 by EDX.
Figure 17D:
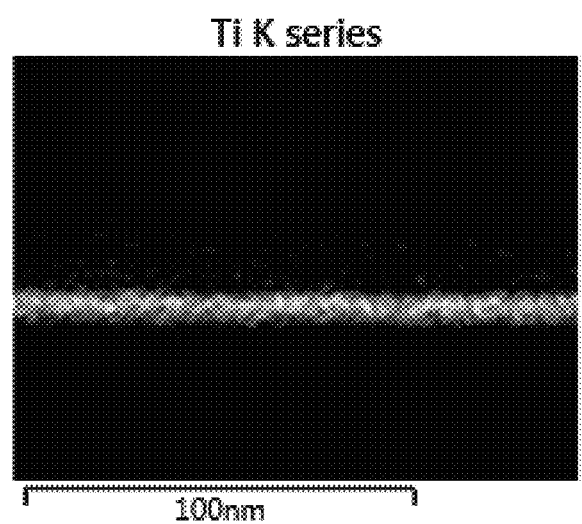
FIG. 17D shows a result of mapping the element distribution of titanium (Ti) of the cross-section of a sample prepared in Example 6 by EDX.
Figure 17E:
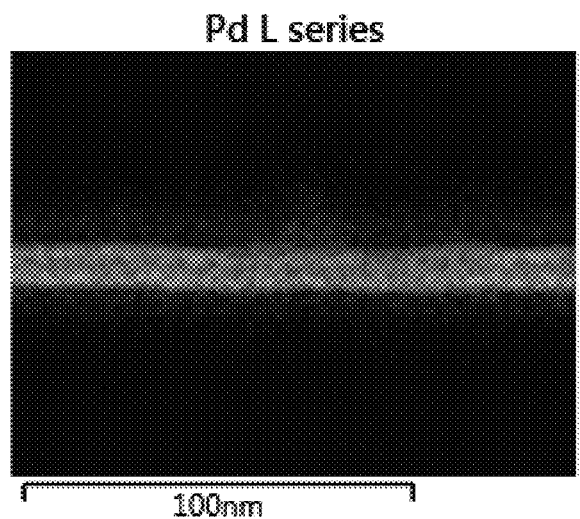
FIG. 17E shows a result of mapping the element distribution of palladium (Pd) of the cross-section of a sample prepared in Example 6 by EDX.
Figure 17F:
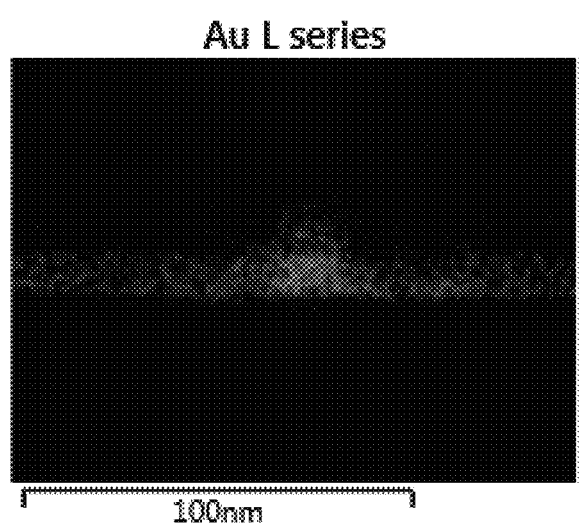
FIG. 17F shows a result of mapping the element distribution of gold (Au) of the cross-section of a sample prepared in Example 6 by EDX.

FIG. 17B and FIG. 17C show that the base insulating film is silicon oxide, and FIG. 17D shows that a titanium (Ti) layer is formed on the base insulating layer. FIG. 17E shows a palladium (Pd) layer is formed on the titanium (Ti) layer, and FIG. 17F shows the presence of gold (Au). Here, when FIG. 17E and FIG. 17F are observed in detail, in FIG. 17E, it is observed that palladium (Pd) is dispersedly arranged in some region so as to protrude upward from the region identified as a palladium (Pd) layer. From the comparison with the data shown in FIG. 17F, it can be seen that the protruding portion overlaps with the region on which gold is grown. For gold (Au), as shown in FIG. 17F, it is also confirmed that it is present in the region of the palladium (Pd) layer, and in particular, it is observed that the density of the region overlapping with the portion where gold (Au) is grown into a hemispherical mountain shape is increased.

From this, it can be seen that in the electroless gold plating, gold (Au) is heteroepitaxially grown while interdiffusion with palladium (Pd). Then, gold (Au) is considered to form a solid solution at an interface with the palladium (Pd) layer. Due to such a structure, it is considered that the adhesion of gold (Au) heteroepitaxially grown on the palladium (Pd) layer is enhanced and the contact resistance is reduced.

Figure 18A:
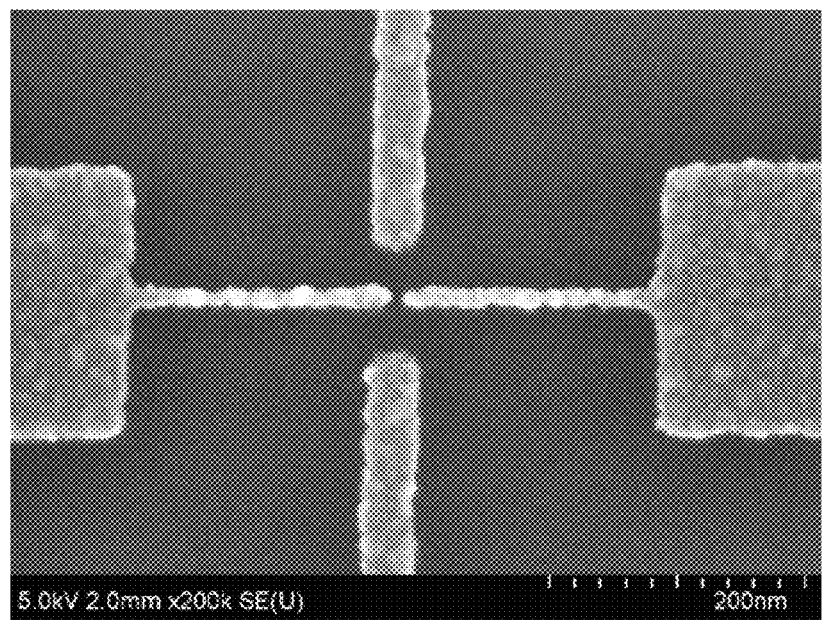
FIG. 18A shows a SEM image of palladium (Pd) electrodes prepared in Example 6 before electroless gold plating.
Figure 18B:
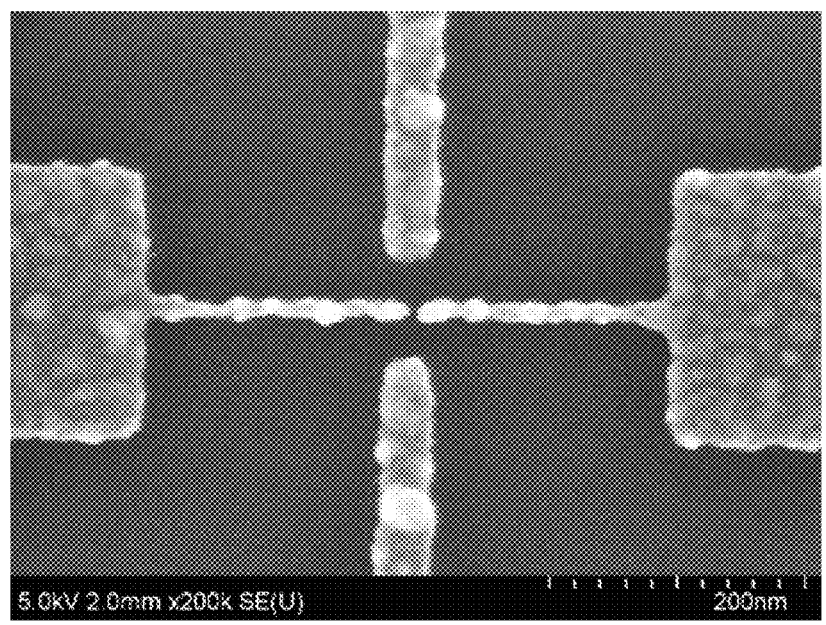
FIG. 18B shows a SEM image of palladium (Pd) electrodes prepared in Example 6 before electroless gold plating.
Figure 19A:
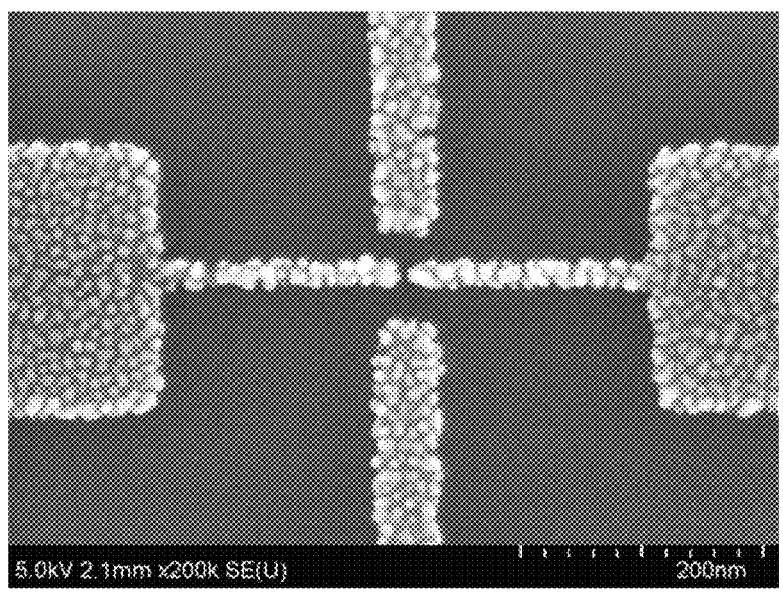
FIG. 19A shows a SEM image of nanogap electrodes prepared in Example 6.
Figure 19B:
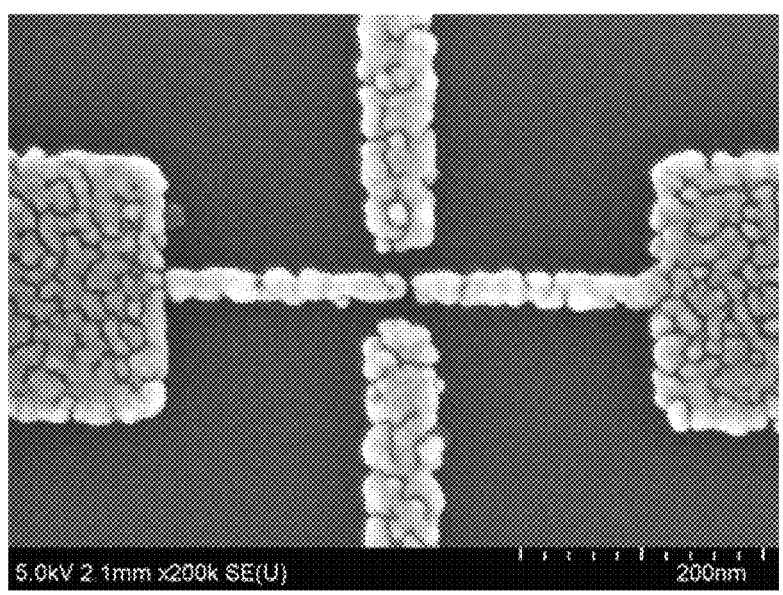
FIG. 19B shows a SEM image of nanogap electrodes prepared in Example 6.

FIG. 18A and FIG. 17B are samples made in the present example, showing SEM images of the palladium (Pd) electrodes before electroless gold plating. FIG. 18A and FIG. 18B are samples prepared under the same conditions as in the third embodiment, except that palladium (Pd) is used as the first metal portion 104. FIG. 19A and FIG. 19B show SEM images of nanogap electrodes formed by electroless gold plating on the electrode patterns formed of palladium (Pd). FIG. 19A shows an SEM image of a sample prepared by repeating the electroless gold plating treatment for 5 seconds and the pure water rinsing treatment for 5 seconds for a total of 3 times, and FIG. 19B shows an SEM image of a sample prepared by repeating the electroless gold plating treatment for 10 seconds and the pure water rinsing treatment for 10 seconds for a total of 3 times. In both cases, gold (Au) was grown hemispherically, it was confirmed that the nanogap electrode is formed. In the sample of FIG. 19B in which the electroless gold plating treatment time is long, the hemispherical grown gold is connected to each other. This is because the plating proceeds in a wet state in the present plating so that the adjacent hemispherical plating grains grow into a continuous plating film with the progress of the plating. Compared to the regions with a width of 200 nm on the left and right, the continuous plating film is observed remarkably in the part of the narrow linewidth forming the nanogap, suggesting that the narrower linewidth, the higher the nucleation frequency of the plating.

According to the present example, it was confirmed that even when palladium (Pd) was used as the first metal portion, gold (Au) as the second metal portion was heteroepitaxially grown. Unlike the case of the growth mechanism where the first metal portion is platinum (Pt), it was confirmed that the gold (Au) is heteroepitaxially grown while forming a solid solution accompanied by interdiffusion.

Supplemental Description

Although some or all of the exemplary embodiments of the present disclosure may be described as the following supplemental description, one embodiment of the present disclosure is not limited thereto.

Supplemental Description 1: A metal stack having heteroepitaxial structure in an embodiment according to the present invention includes a first metal portion having a polycrystalline structure, at least one second metal portion on the first metal portion, the at least one second metal portion has an island-shaped structure on the first metal portion, the at least one second metal portion is provided corresponding to at least one crystalline grain exposed to a surface of the first metal portion, the at least one second metal portion and the at least one crystalline grain have a heteroepitaxial interface, and a third metal portion covering the at least one second metal portion on the first metal portion.

Supplemental Description 2: The metal stack having heteroepitaxial structure according to supplemental description 1, wherein the at least one second metal portion includes a plurality of the second metal portions, the plurality of the second metal portions is discretely arranged on a surface of the first metal portion.

Supplemental Description 3: The metal stack having heteroepitaxial structure according to supplemental description 2, wherein the plurality of second metal portions is dispersed on the surface of the first metal portion at a density of not less than 50/μm² and not more than 2000/μm² per unit area.

Supplemental Description 4: The metal stack having heteroepitaxial structure according to supplemental description 2, wherein the ratio of the total area of the plurality of second metal portions in contact with the first metal portion to the surface of the first metal portion is 0.1 or more and 0.8 or less.

Supplemental Description 5: The metal stack having heteroepitaxial structure according to any one of supplemental description 1, wherein the third metal portion is a metal of the same as the at least one second metal portion, a metal of a different kind, or an alloy.

Supplemental Description 6: A method for forming metal stack having heteroepitaxial structure in an embodiment according to the present invention, the method includes dipping a first metal portion having a polycrystalline structure in an electroless plating solution containing a metal ion of a second metal different from the first metal portion, an ion of a halogen element as an oxidizing agent, and a reducing agent, heteroepitaxial growing at least one second metal portion reduced from a metal ion of the second metal by a surface limited redox replacement corresponding to the reduced surface of at least one crystalline grain of the first metal portion while reducing the surface of the first metal portion by the oxidizing agent and the reducing agent, forming a third metal portion covering the at least one second metal portion on the metal portion after the forming heteroepitaxial structure.

Supplemental Description 7: The method for forming metal stack containing heteroepitaxial structure according to supplemental description 6, wherein the at least one second metal portion includes a plurality of the second metal portions, the plurality of the second metal portions forms so as to be discrete on the surface of the first metal portion.

Supplemental Description 8: The method for forming metal stack containing heteroepitaxial structure according to supplemental description 7, wherein the plurality of second metal portions forms on the surface of the first metal portion at a density of not less than 50/μm² and not more than 2000/μm² per unit area.

Supplemental Description 9: The method for forming metal stack containing heteroepitaxial structure according to any one of supplemental description 6, wherein the third metal portion forms a metal of the same as the at least one second metal portion, a metal of a different kind, or an alloy.

Supplemental Description 10: A method for forming nanogap electrode in an embodiment according to the present invention, the method includes forming a first electrode pattern and a second electrode pattern each having a linear pattern having a width of 20 nm or less and arranged with one end thereof opposed to each other and spaced apart from each other by a first metal portion having a polycrystalline structure; dipping the first electrode pattern and the second electrode pattern in an electroless plating solution containing a metal ion of a second metal different from the first metal portion, an ion of a halogen element as an oxidizing agent, and a reducing agent, heteroepitaxial growing a metal reduced from a metal ion of the second metal by an electrochemical substitution reaction continuously covers the surfaces of the first electrode pattern and the second electrode pattern, while reducing the surfaces of the first electrode pattern and the second electrode pattern by the oxidizing agent and the reducing agent, and forming the first electrode pattern and the second electrode pattern that a distance between each end of the first electrode pattern and the second electrode pattern is 5 nm or less.

Supplemental Description 11: The method for forming nanogap electrode according to supplemental description 10, further includes growing a second metal portion forming a heteroepitaxial interface on the surface of the first metal portion in a hemispherical shape by the heteroepitaxial growth.

Supplemental Description 12: The method for forming nanogap electrode according to supplemental description 11, further includes growing a second metal portion by the heteroepitaxial growth so as to cover the surface of the first metal portion.

Supplemental Description 13: The method for forming heteroepitaxial structure according to supplemental description 10, wherein the first metal portion is platinum, the metal ion is gold ion ($Au^+$, $Au^{3+}$), the ion of the halogen element is iodine ion ($I^-$, $I_3^-$), and the reducing agent is L(+)-ascorbic acid ($C_6H_8O_6$).

INDUSTRIAL APPLICABILITY

The heteroepitaxial structure and the stack having heteroepitaxial structure according to an embodiment of the present invention can be applied as an electrode structure of an electronic device. For example, it can be applied as a structure of a sensing electrode detecting material in a biosensor. It can also be applied as an electrode structure for power semiconductors such as power MOS transistors.

What is claimed is:

1. A heteroepitaxial structure, comprising:
   a first metal portion having a polycrystalline structure;
   a second metal portion on the first metal portion;
   the second metal portion has a mountain shape or a hemispherical shape;
   the second metal portion is provided corresponding to at least one crystalline grain exposed to a surface of the first metal portion; and
   the second metal portion and the at least one crystalline grain have a heteroepitaxial interface.

2. The heteroepitaxial structure according to claim 1, wherein the first metal portion comprises a metal element selected from platinum (Pt), palladium (Pd), rhodium (Rh), ruthenium (Ru), osmium (Os) and iridium (Ir), and the second metal portion is gold (Au).

3. The heteroepitaxial structure according to claim 1, wherein the first metal portion is palladium (Pd), the second metal portion is gold (Au), and an interface between the first metal portion and the second metal portion includes a solid solution of the first metal portion and the second metal portion.

4. A nanogap electrode, comprising:
   a first electrode and a second electrode each including a first metal portion and a second metal portion on the first metal portion, the first metal portion having a polycrystalline structure,
   wherein the first metal portion has a linear pattern having a width of 20 nm or less,
   the second metal portion is disposed at least on one end of the linear pattern of the first metal portion and has a mountain shape or a hemispherical shape,
   a heteroepitaxial interface is formed corresponding to at least one crystalline grain exposed to a surface of the first metal portion, and
   a distance between the second metal portions on the first electrode and on the second electrode is 5 nm or less.

5. The nanogap electrode according to claim 4, wherein the second metal portion includes a plurality of crystal regions having different crystal orientations.

6. The nanogap electrode according to claim 4, wherein the first metal portion comprises a metal element selected from platinum (Pt), palladium (Pd), rhodium (Rh), ruthenium (Ru), osmium (Os) and iridium (Ir), and the second metal portion is gold (Au).

7. The nanogap electrode according to claim 4, wherein the first metal portion is palladium (Pd), the second metal portion is gold (Au), and an interface between the first metal portion and the second metal portion includes a solid solution of the first metal portion and the second metal portion.

8. The nanogap electrode according to claim 4, wherein the second metal portion is disposed at one end on a substantially central axis of the linear pattern of the first metal portion.

9. The nanogap electrode according to claim 4, wherein the first metal portion has a linear pattern having a width of 15 nm or less.

* * * * *